US011362142B2

(12) United States Patent
Hu

(10) Patent No.: US 11,362,142 B2
(45) Date of Patent: Jun. 14, 2022

(54) ELECTRONIC APPARATUS WITH TIERED STACKS HAVING CONDUCTIVE STRUCTURES ISOLATED BY TRENCHES, AND RELATED ELECTRONIC SYSTEMS AND METHODS

(71) Applicant: Micron Technology, Inc., Boise, ID (US)

(72) Inventor: Yi Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 16/877,209

(22) Filed: May 18, 2020

(65) Prior Publication Data
US 2021/0358890 A1    Nov. 18, 2021

(51) Int. Cl.
| | |
|---|---|
| H01L 27/24 | (2006.01) |
| H01L 21/768 | (2006.01) |
| H01L 21/8238 | (2006.01) |
| H01L 27/112 | (2006.01) |
| H01L 25/065 | (2006.01) |
| H01L 21/02 | (2006.01) |

(52) U.S. Cl.
CPC .... *H01L 27/2481* (2013.01); *H01L 21/02074* (2013.01); *H01L 21/76885* (2013.01); *H01L 21/823885* (2013.01); *H01L 25/0657* (2013.01); *H01L 27/1128* (2013.01); *H01L 27/11273* (2013.01); *H01L 27/2454* (2013.01)

(58) Field of Classification Search
CPC ............ H01L 25/0657; H01L 27/2481; H01L 27/11273; H01L 27/1128; H01L 27/2454
See application file for complete search history.

(56) References Cited

U.S. PATENT DOCUMENTS 9,490,262 B1    11/2016    Pang et al.
9,922,987 B1 *   3/2018    Mizutani .......... H01L 27/11565
(Continued)

FOREIGN PATENT DOCUMENTS

CN      107658306 A     2/2018

OTHER PUBLICATIONS

Greenlee et al., Tungsten Structures and Methods of Forming the Structures, U.S. Appl. No. 16/730,505, filed Dec. 30, 2019.

*Primary Examiner* — Michael Jung
(74) *Attorney, Agent, or Firm* — TraskBritt

(57) ABSTRACT

Methods for forming microelectronic devices include forming lower and upper stack structures, each comprising vertically alternating sequences of insulative and other structures arranged in tiers. Lower and upper pillar structures are formed to extend through the lower and upper stack structures, respectively. An opening is formed through the upper stack structure, and at least a portion of the other structures of the upper stack are replaced by (e.g., chemically converted into) conductive structures, which may be configured as select gate structures. Subsequently, a slit is formed, extending through both the upper and lower stack structures, and at least a portion of the other structures of the lower stack structure are replaced by a conductive material within a liner to form additional conductive structures, which may be configured as access lines (e.g., word lines). Microelectronic devices and structures and related electronic systems are also disclosed.

23 Claims, 21 Drawing Sheets

(56) References Cited

U.S. PATENT DOCUMENTS

| | | | |
|---|---|---|---|
| 9,972,640 B1* | 5/2018 | Kai | .................. H01L 21/31116 |
| 10,170,493 B1 | 1/2019 | Greenlee | |
| 10,242,995 B2 | 3/2019 | Zhu et al. | |
| 10,283,524 B1 | 5/2019 | Greenlee et al. | |
| 10,290,650 B1 | 5/2019 | Iwai | |
| 10,475,804 B1 | 11/2019 | Nishikawa et al. | |
| 2003/0011023 A1 | 1/2003 | Hurley | |
| 2005/0133851 A1 | 6/2005 | Forbes | |
| 2009/0321943 A1 | 12/2009 | Meldrim et al. | |
| 2011/0104869 A1 | 5/2011 | Hyun et al. | |
| 2014/0001530 A1 | 1/2014 | Song | |
| 2014/0264533 A1 | 9/2014 | Simsek-Ege et al. | |
| 2015/0348989 A1 | 12/2015 | Pekny | |
| 2016/0071864 A1 | 3/2016 | Noda | |
| 2016/0204122 A1 | 7/2016 | Shoji et al. | |
| 2016/0300848 A1* | 10/2016 | Pachamuthu | ....... H01L 23/5226 |
| 2019/0067320 A1 | 2/2019 | Cho et al. | |
| 2019/0333581 A1 | 10/2019 | Diep et al. | |

* cited by examiner

ELECTRONIC APPARATUS WITH TIERED STACKS HAVING CONDUCTIVE STRUCTURES ISOLATED BY TRENCHES, AND RELATED ELECTRONIC SYSTEMS AND METHODS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. 3D NAND memory devices also include electrical connections between, e.g., access lines (e.g., word lines) and other conductive structures of the device so that the memory cells of the vertical strings can be selected for writing, reading, and erasing operations.

To form some 3D NAND memory devices, the stack of tiers is initially formed as an alternating structure of insulating materials and sacrificial materials, which sacrificial materials are subsequently removed and replaced with the conductive materials. Retaining the structural integrity of the insulating materials during the removal of the sacrificial materials and replacement of the conductive materials presents challenges.

DETAILED DESCRIPTION

Figure 1:
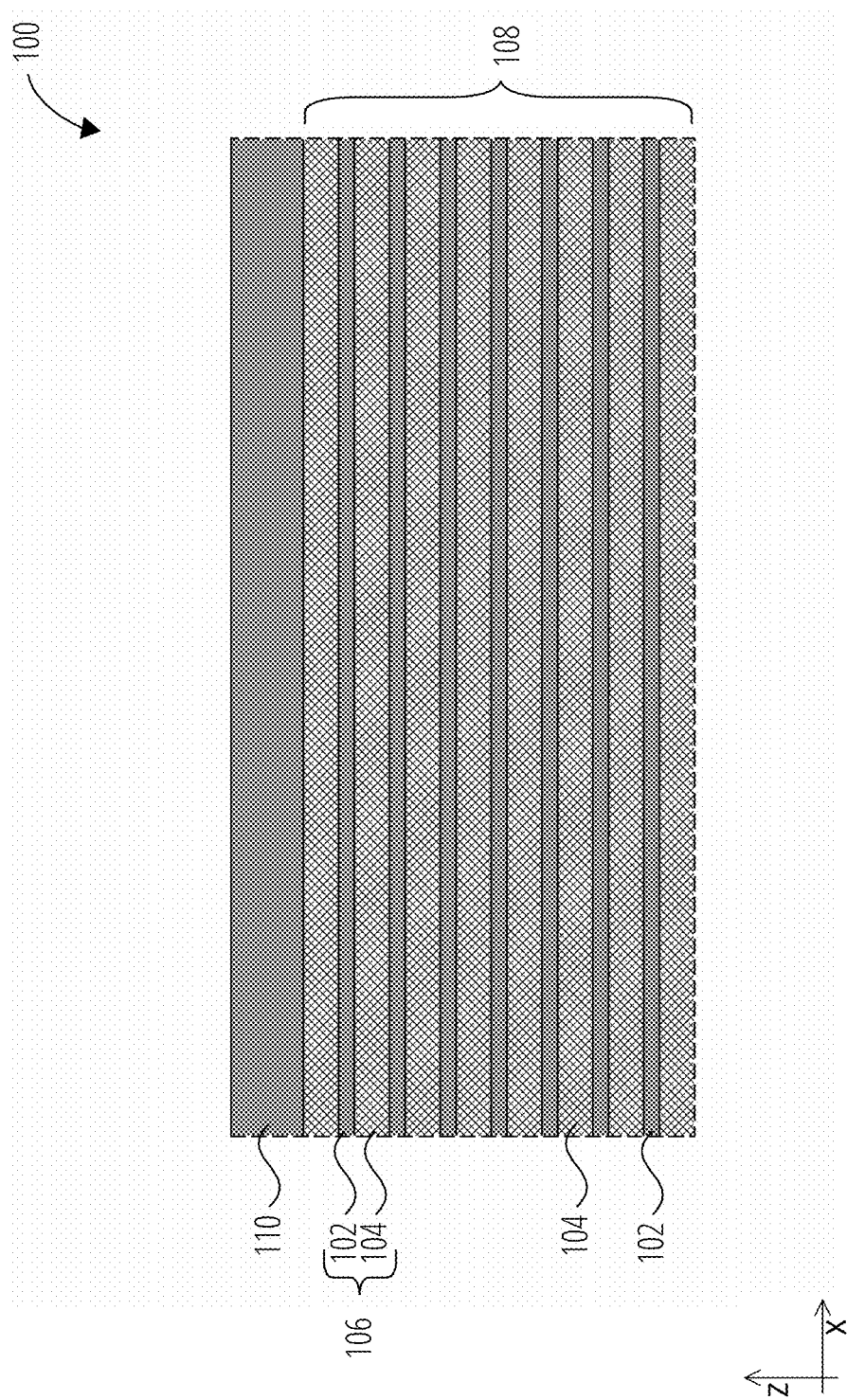
FIG. 1 through FIG. 17 are cross-sectional, elevational, schematic illustrations during various stages of processing to fabricate a microelectronic device structure, illustrated in FIG. 17, for an electronic apparatus, in accordance with embodiments of the disclosure.

Structures (e.g., microelectronic device structures), apparatus (e.g., microelectronic devices), and systems (e.g., electronic systems), according to embodiments of the disclosure, include a first stack of vertically alternating conductive structures and insulative structures in tiers and a second stack of vertically alternating conductive structures and insulative structures in tiers. The conductive structures of the first stack may be configured as access lines (e.g., word lines) of the apparatus, while the conductive structures of the second stack may be configured as select gates (e.g., select gate drains) of the apparatus. The conductive structures may be formed by first forming a nonconductive material where conductive materials are to be formed. The conductive structures for the select gate drains are formed by forming openings extending through the first stack and converting the nonconductive material of the second stack to a conductive material. The openings electrically isolate the conductive structures for the select gates drains from their neighbors. Subsequently, the conductive structures for the access lines are formed by forming another opening (e.g., a "slit") extending through the first stack and the second stack and replacing the nonconductive material of the first stack with conductive materials (e.g., a conductive liner and another conductive material). Accordingly, by embodiments of the disclosure, the conductive structures for the select gate drains and the openings in the second stack are formed prior to forming the slit that extends into the first stack. Therefore, should the slit formation cause material expansion or bending (e.g., due to residual stresses), such expansion or bending does not negatively impact the design or formation of the openings in the second stack, because such openings have already been formed. Thus, the openings formed in the second stack may be designed, patterned, and formed to be nearer to neighboring features (e.g., pillars) than if such design, patterning, and formation had to account for (e.g., include a wide "processing margin" for) possible material expansion or bending caused by the slit formation. Moreover, the already-formed conductive structures in the second stack may provide additional material and structural integrity at the time of the slit formation, which may inhibit expansion or bending of materials upon formation of the slit.

As used herein, the term "tiered structure" means and includes a structure with "insulative structures" interleaved, one above the other, with other structures (e.g., "conductive structures"). As used herein, an "insulative structure" of a "tiered structure" means and refers to a level, in the tiered structure, that comprises one or more insulative material. As used herein, a "conductive structure" of a "tiered structure" means and refers to a level, in the tiered structure, that comprises, at least in a completed structure, one or more conductive material (e.g., of an access line, of a select gate drain) and which conductive structure is disposed vertically between a pair of insulative structures, e.g., with one insulative structure below and one insulative structure above.

As used herein, the term "stack" means and includes a portion of a tiered structure, which "stack" includes at least some conductive structures of the tiered structure interleaved with at least some insulative structures of the tiered structure. Thus, a "stack" is a sub-structure of a "tiered structure."

As used herein, the term "memory device" means and includes a microelectronic device exhibiting memory functionality, but not necessarily limited to memory functionality. In other words, and by way of example only, the term "memory device" means and includes not only conventional memory in the form of DRAM, NAND, etc., but also—by way of example only—an application-specific integrated circuit (ASIC) (e.g., a system on a chip (SoC)), a microelectronic device combining logic and memory, or a graphics processing unit (GPU) incorporating memory.

As used herein, the terms "opening" and "slit" mean a volume extending through at least one structure or at least one material, leaving a gap in that at least one structure or at least one material, or a volume extending between structures or materials, leaving a gap between the structures or materials. Unless otherwise described, an "opening" or "slit" is not necessarily empty of material. That is, an "opening" or "slit" is not necessarily void space. An "opening" or "slit" formed in or between structures or materials may comprise structure(s) or material(s) other than that in or between which the opening or slit is formed. And, structure(s) or material(s) "exposed" within an opening or slit is (are) not necessarily in contact with an atmosphere or non-solid environment. Structure(s) or material(s) "exposed" within an opening or slit may be adjacent or in contact with other structure(s) or material(s) that is (are) disposed within the opening or slit.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "sacrificial," when referring to a material or structure, means and includes a material or structure that is formed during a fabrication process but which is removed prior to completion of the fabrication process.

As used herein, the term "convertible," when referring to a material or structure, means and includes a material or structure that may be altered (e.g., chemically altered) during a fabrication process to exhibit a different chemical composition.

As used herein, the term "replaceable," when referring to a material or structure, means and includes a material or structure that is formed during a fabrication process but which is replaced by another material or structure—e.g., by converting the replaceable material or structure to the other material or structure or by removing the replaceable material and forming the other material or structure in place of the replaceable material—prior to completion of the fabrication process. Therefore, the definition of a "replaceable" material or structure includes a "sacrificial" material or structure as well as a "convertible" material or structure.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis and/or parallel to an indicated "Y" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the terms "inner" and "outer" are relative terms indicating a disposition relative to a longitudinal axis of a structure. Materials, structures, and sub-structures nearest the longitudinal axis may be construed as "inner" or "inward" relative to other materials, structures, and sub-structures further from the longitudinal axis, which other materials, structures, and sub-structures may be construed as "outer" or "outward" relative to the inner or inward materials, structures, and sub-structures.

As used herein, the terms "thickness" and "thinness" mean and include a dimension in a straight-line direction that is normal to the closest surface of an immediately adjacent material or structure that is of a different composition or that is otherwise distinguishable from the material or structure whose thickness or thinness is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"-when referring to a parameter, property, or condition of one structure, material, or feature in comparison to the parameter, property, or condition of another such structure, material, or feature-means and includes the parameter, property, or condition of the two such structures, materials, or features being equal, substantially equal, or about equal, at least in terms of respective portions of such structures, materials, or features. For example, two structures having "consistent" thicknesses as one another may each define a same, substantially same, or about the same thickness at X lateral distance from a feature, despite the two structures being at different elevations along the feature.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate and/or further from an upper surface of the structure, while "higher levels" and "higher elevations" are further from the primary surface of the substrate and/or nearer to the upper surface of the structure. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

Figure 17:
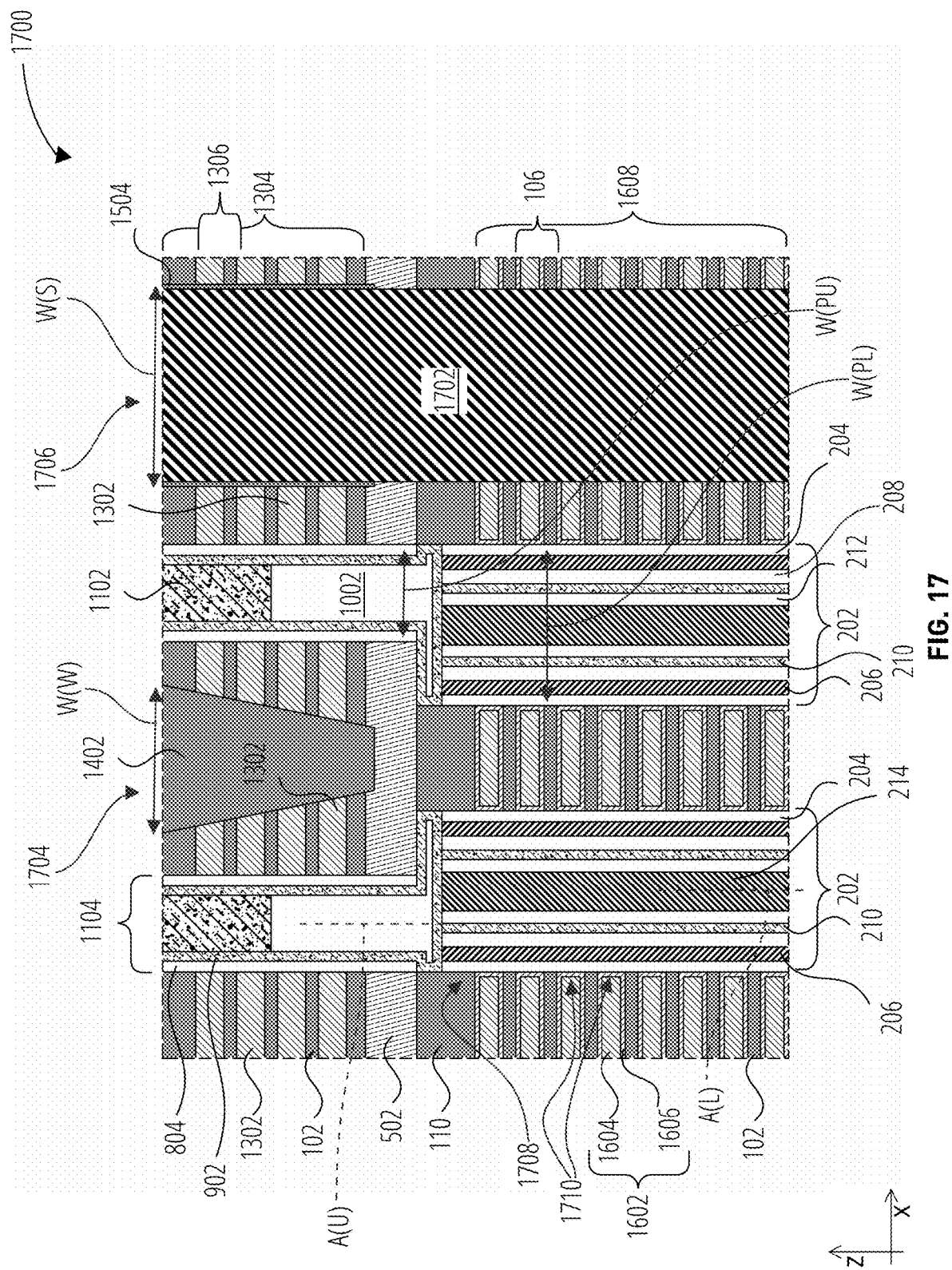
Figure 18:
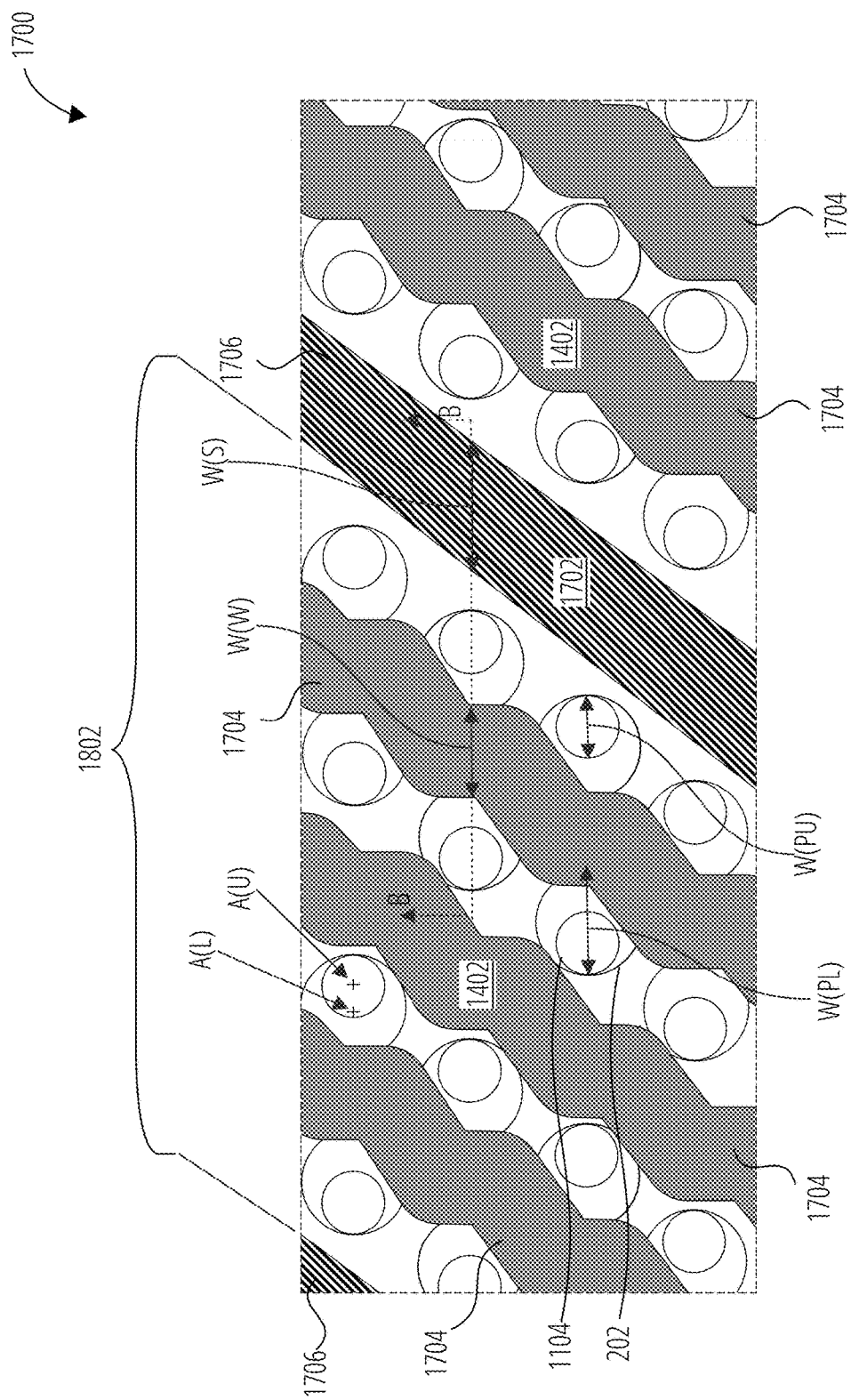
FIG. 18 is a top plan, schematic illustration of the microelectronic device structure of FIG. 17, with certain features illustrated only as cross-sectional areas and with other features not illustrated for ease of illustration, wherein the illustration of FIG. 17 is taken along section line B-B of FIG. 18, in accordance with embodiments of the disclosure.

FIG. 1 through FIG. 17 illustrate a method of forming a microelectronic device structure, which is illustrated in FIG. 17, in accordance with embodiments of the disclosure. Each of these figures is a simplified, cross-sectional, elevational illustration of a microelectronic device structure during various stages of fabrication. FIG. 18 is a simplified, top-down, plan view, illustration of the microelectronic device structure illustrated in FIG. 17.

With reference to FIG. 1, a method for forming a microelectronic device structure may include forming a structure 100 that includes a vertically (e.g., in the Z-direction) alternating sequence of insulative structures 102 and sacrificial structures 104 arranged in tiers 106. Together, the tiers 106 form a stack structure (e.g., a lower stack structure 108). Each of the tiers 106 may individually include a level of one of the insulative structures 102 directly vertically adjacent one or two levels of the sacrificial structures 104. Herein, the insulative structures 102 may otherwise be referred to as "insulative materials" and the sacrificial structures 104 may otherwise be referred to as "sacrificial materials."

In some embodiments, a number (e.g., quantity) of the tiers 106 of the lower stack structure 108 may be within a range of from 32 tiers to 256 tiers. In some embodiments, the lower stack structure 108 includes 128 of the tiers 106. However, the disclosure is not so limited, and the lower stack structure 108 may include a different number of the tiers 106.

The lower stack structure 108 may be formed on, and may be supported by, an underlying source structure. In some embodiments, the lower stack structure 108 may include a first deck structure overlying the source structure, and a second deck structure overlying the first deck structure, each of the first and second deck structures including some of the insulative structures 102 and some of the sacrificial structures 104. For example, the lower stack structure 108 may be formed to eventually provide a dual-deck 3D NAND device (e.g., a 3D NAND Flash memory device).

The levels of the insulative structures 102 may be formed of and include, for example, at least one insulative material (e.g., at least one dielectric material), such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), tantalum oxide ($TaO_2$), magnesium oxide (MgO), and aluminum oxide ($Al_2O_3$)). In some embodiments, the insulative structures 102 are formed of and include silicon dioxide.

The levels of the sacrificial structures 104 may be formed of and include an insulative material that is different than, and exhibits an etch selectivity with respect to, the insulative material of the insulative structures 102. In some embodiments, the sacrificial structures 104 are formed of and include a nitride material (e.g., silicon nitride ($Si_3N_4$)) or an oxynitride material (e.g., silicon oxynitride). In some embodiments, the sacrificial structures 104 comprise silicon nitride.

In some embodiments, the lower stack structure 108 may be formed over a source structure (e.g., a source plate), which may be formed of and include, for example, a semiconductor material doped with one of P-type conductivity materials (e.g., polysilicon doped with at least one P-type dopant (e.g., boron ions)) or N-type conductivity materials (e.g., polysilicon doped with at least one N-type dopant (e.g., arsenic ions, phosphorous ions, antimony ions)). The lower stack structure 108 may be directly on the source structure, or the lower stack structure 108 may overlie a deck structure comprising additional tiers (e.g., additional levels of the tiers 106 of the insulative structures 102 and the sacrificial structures 104). Such additional tiers may be separated from the lower stack structure 108 by one or more dielectric materials.

The lower stack structure 108 may be formed by forming (e.g., depositing) the materials of the insulative structures 102 and the sacrificial structures 104 sequentially, from bottom to top such as by depositing—on or over a substrate (e.g., a source structure on a substrate)—the insulative material of a lowest insulative structure 102 of the lower stack structure 108, then depositing the sacrificial material of a lowest sacrificial structure 104 of the lower stack structure 108, then depositing the insulative material of the second-lowest insulative structure 102, and so on.

A dielectric material 110 may be formed (e.g., deposited) on the lower stack structure 108, e.g., above an uppermost one of the tiers 106 (e.g., above an uppermost sacrificial structure 104 of the lower stack structure 108). The dielectric material 110 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 110 comprises the same material composition as the insulative material of the insulative structures 102. In other embodiments, the dielectric material 110 comprises a different material composition than the insulative material of the insulative structures 102. In some embodiments, the dielectric material 110 comprises silicon dioxide. The dielectric material 110 may be formed to be thicker than some or all of the insulative structures 102, individually.

Figure 2:
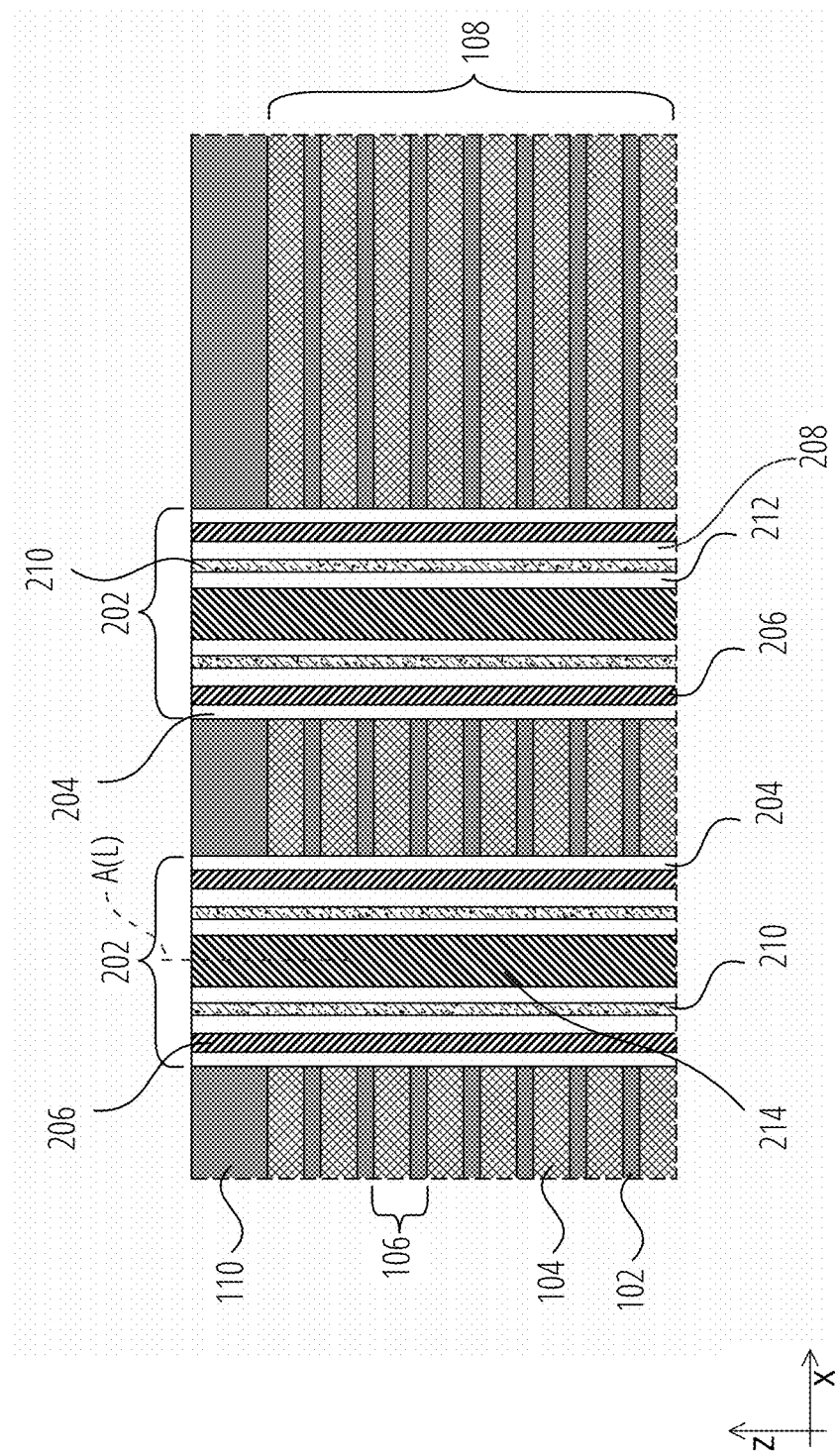

With reference to FIG. 2, pillar structures 202 may be formed to vertically extend (e.g., in the Z-direction) through the lower stack structure 108 and the dielectric material 110. For example, openings may be formed (e.g., etched) through the lower stack structure 108 and the dielectric material 110, and then materials of the pillar structures 202 may be formed (e.g., deposited) in the openings. As will be described herein, the materials of the pillar structures 202 may form memory cells (e.g., strings of NAND memory cells).

Each of the pillar structures 202 may have a substantially cylindrical shape, with a substantially circular cross-sectional area (e.g., along a horizontal (e.g., X-Y plane)). The pillar structures 202 may each individually comprise—in order from outermost material or structure to innermost material or structure, relative to an axial centerline of the pillar structure 202—a charge-blocking structure 204 (e.g., formed of and including a dielectric blocking material), a charge trap structure 206 (e.g., formed of and including at least one memory material), a tunnel dielectric structure 208 (e.g., formed of and including at least one dielectric material), at least one channel material 210, a dielectric structure 212, and an insulative material 214. The dielectric structure 212 may be otherwise referred to herein as a "tunneling dielectric material." The charge-blocking structure 204 may be horizontally interposed the lower stack structure 108 (and the dielectric material 110) and the charge trap structure 206; the charge trap structure 206 may be horizontally interposed between the charge-blocking structure 204 and the tunnel dielectric structure 208; the tunnel dielectric structure 208 may be horizontally interposed between the charge trap structure 206 and the channel material 210; the channel material 210 may be horizontally interposed between the tunnel dielectric structure 208 and the dielectric structure 212; the dielectric structure 212 may be horizontally interposed between the channel material 210 and the insulative material 214. The insulative material 214 may extend along a longitudinal axis A(L) of the pillar structure 202.

The insulative material 214 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 214 comprises silicon dioxide.

The dielectric structure 212 may be formed of and include one or more dielectric materials, such as one or more of the materials described above with reference to the insulative material 214. In some embodiments, the dielectric structure 212 comprises the same material composition as the insulative material 214. In some embodiments, the dielectric structure 212 comprises silicon dioxide.

The channel material 210 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, channel material 210 includes amorphous silicon or polysilicon. In some embodiments, the channel material 210 comprises a doped semiconductor material, and the channel material 210 may be formed as a "doped hollow channel" (DHC) structure.

The tunnel dielectric structure 208 may be formed of and include a dielectric material through which charge tunneling may be performed under suitable electrical bias conditions, such as through hot-carrier injection or by Fowler-Nordheim tunneling induced charge transfer. By way of non-limiting example, the tunnel dielectric structure 208 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric structure 208 comprises silicon dioxide. In other embodiments, the tunnel dielectric structure 208 comprises silicon oxynitride.

The charge trap structure 206 comprises at least one memory material, such as one or more charge-trapping materials and/or one or more conductive materials. The charge trap structure 206 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap structure 206 comprises silicon nitride.

The charge-blocking structure 204 may be formed of and include a dielectric material such as, for example, one or more of an oxide (e.g., silicon dioxide), a nitride (silicon nitride), and an oxynitride (silicon oxynitride), or another material. In some embodiments, the charge-blocking structure 204 comprises silicon oxynitride.

In some embodiments the tunnel dielectric structure 208, the charge trap structure 206, and the charge-blocking structure 204 together may comprise a structure configured to trap a charge, such as, for example, an oxide-nitride-oxide (ONO) structure. In some such embodiments, the tunnel dielectric structure 208 comprises silicon dioxide, the charge trap structure 206 comprises silicon nitride, and the charge-blocking structure 204 comprises silicon dioxide.

Figure 3:
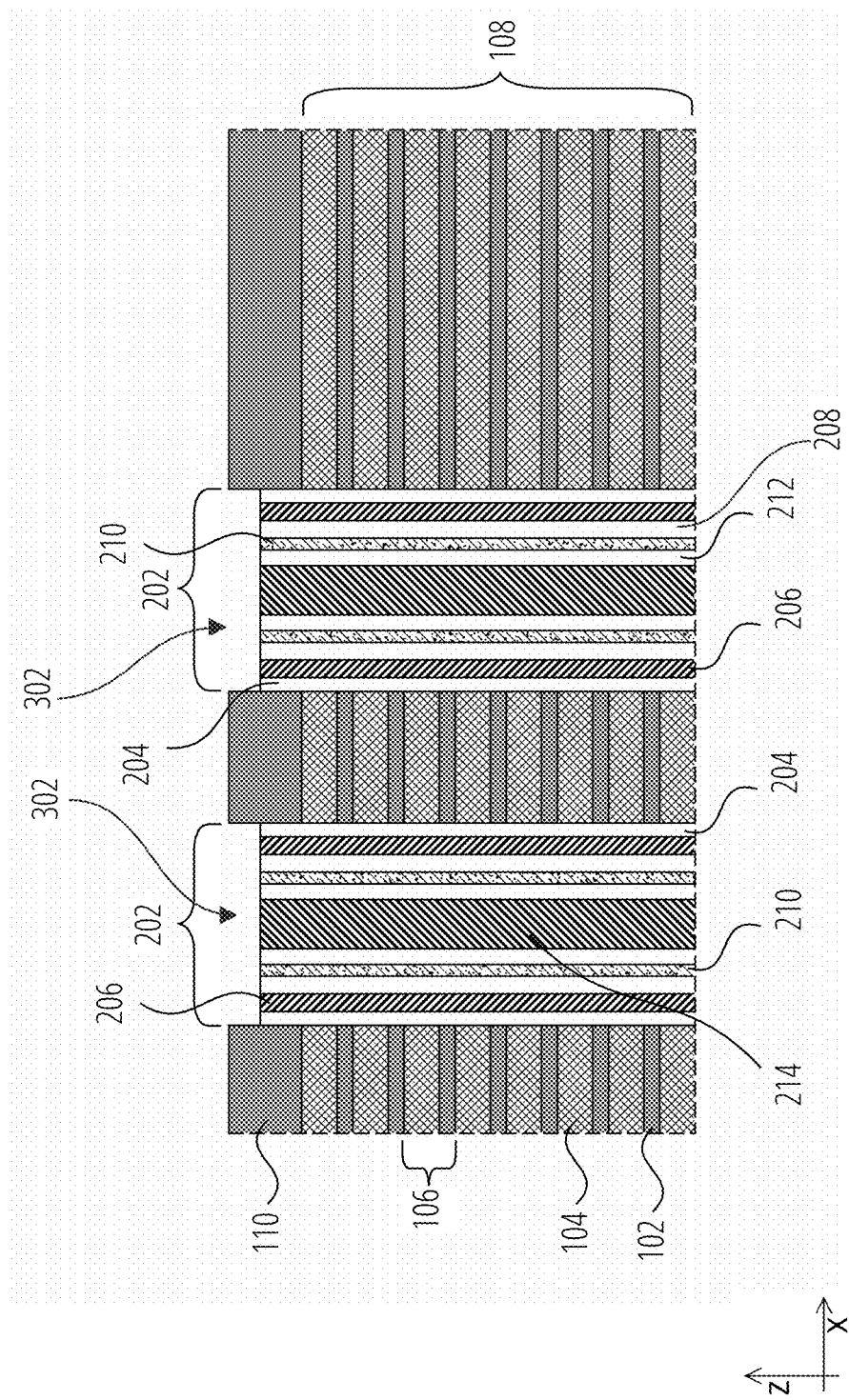

With reference to FIG. 3, after forming the pillar structures 202, a portion of the pillar structures 202 may be removed (e.g., etched) to form a recess 302 atop each of the pillar structures 202, e.g., horizontally adjacent the dielectric material 110. Thus, the pillar structures 202 may be recessed relative to an uppermost surface of the dielectric material 110.

Additional channel material (e.g., which may be the same or different than the channel material 210) may then be formed in the recesses 302 and continued upward into an upper pillar structure that extends vertically through an additional stack structure. For example, FIG. 4 through FIG. 9 illustrate such a method.

Figure 4:
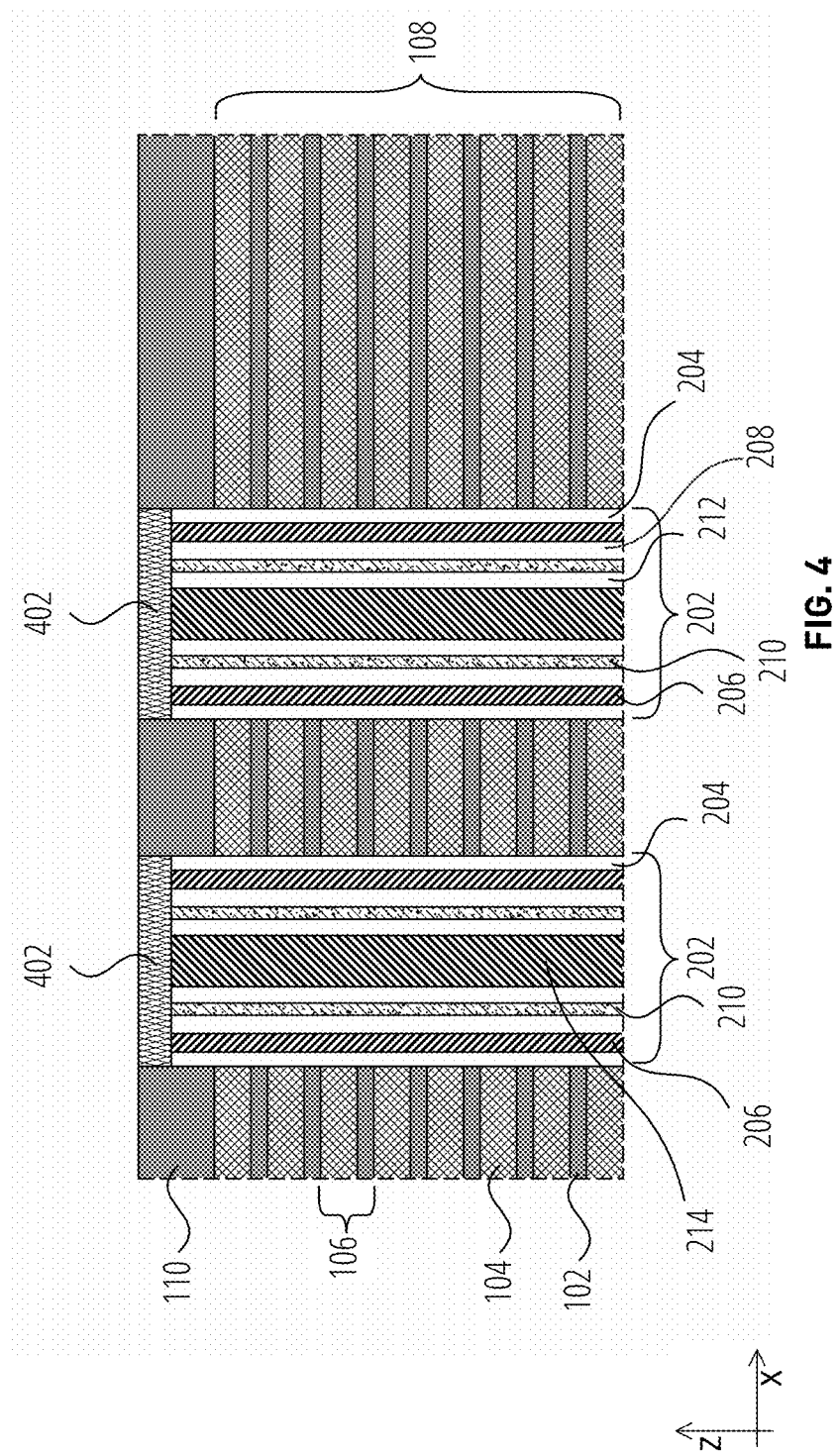

With reference to FIG. 4, a sacrificial fill structure 402 may be formed (e.g., deposited) in the recesses 302 (FIG. 3) to fill the recesses 302. The sacrificial fill structure 402 may be formed of and include, e.g., a polysilicon material or another material formulated to be etched selectively with respect to the material of the dielectric material 110 and, in some embodiments, with respect to materials or all materials of the pillar structures 202.

Figure 5:
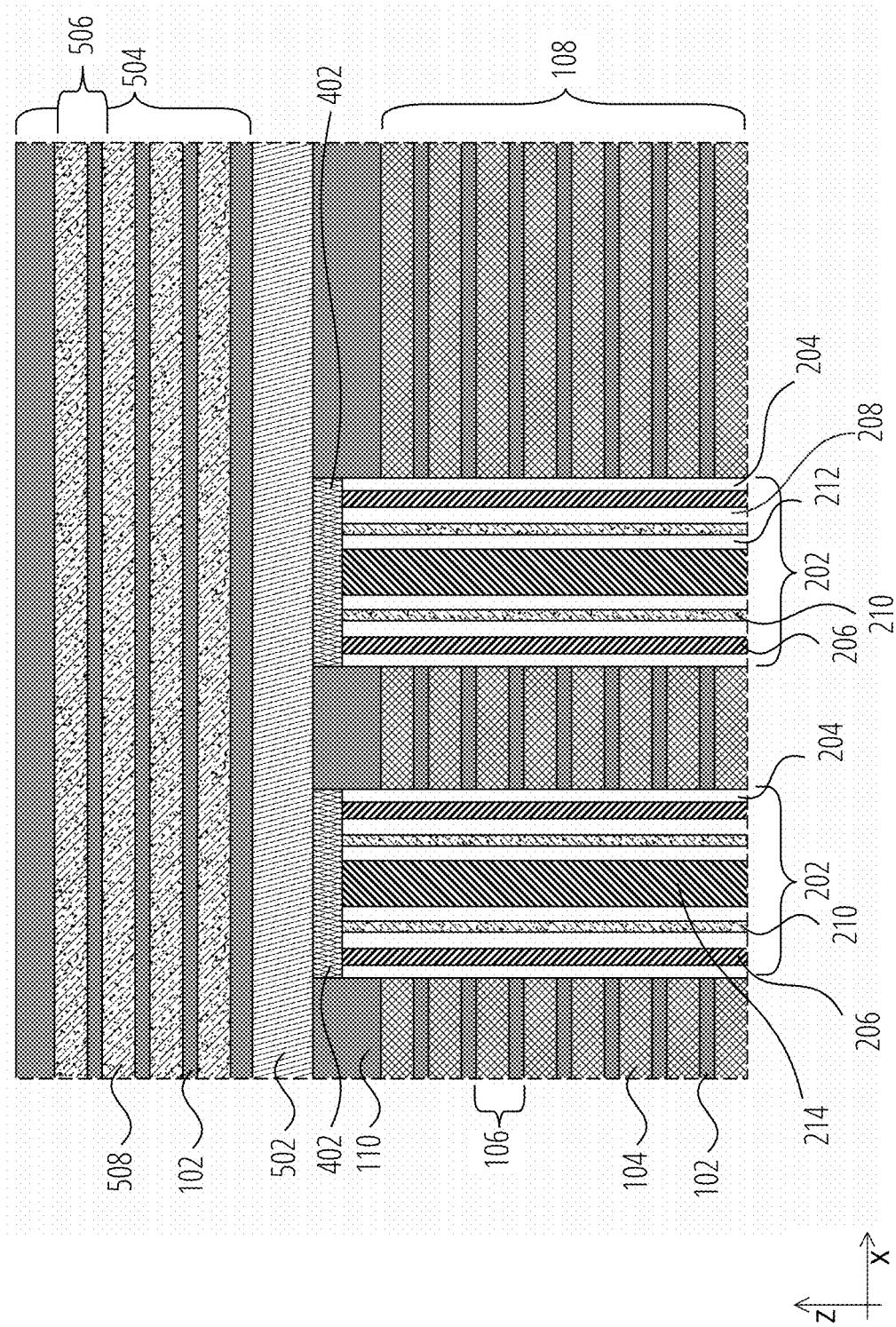

With reference to FIG. 5, an etch stop material 502 may be formed (e.g., deposited) on (e.g., above) the dielectric material 110 and the sacrificial fill structures 402. An upper stack 504 of tiers 506 may be formed over the etch stop material 502 (and, therefore, over the lower stack structure 108). The tiers 506 of the upper stack 504 may include additional levels of the insulative structures 102 vertically alternating and interleaved between replaceable structures 508. The upper stack 504 may include a number (e.g., quantity) of the tiers 506 that is less than the number (e.g., quantity) of the tiers 106 within the lower stack structure 108. For example, in some embodiments, the upper stack 504 may include four of the tiers 506 (e.g., four of the replaceable structures 508).

The etch stop material 502 may be formed of and include, for example, a material exhibiting an etch selectivity with respect to the insulative structures 102 and the replaceable structures 508. In some embodiments, the etch stop material 502 comprises a carbon-containing material (e.g., carbon nitride (SiCN)).

The replaceable structures 508 may be formed of and include one or more replaceable materials (e.g., convertible material(s), sacrificial material(s)) having different etch selectivity than that of the insulative structures 102. The replaceable structures 508 may, for example, be selectively etchable relative to electrically insulative material of the insulative structures 102 during mutual exposure to an etchant. As a non-limiting example, the replaceable structures 508 may be formed of and include silicon, doped silicon, polysilicon, or doped polysilicon. As another non-limiting example, the replaceable structures 508 may be formed of and include silicon nitride. In embodiments where the replaceable structures 508 are doped, the dopant may include one or more of at least one N-type dopant (such as one or more of phosphorus (P), arsenic (Ar), antimony (Sb), and bismuth (Bi)), at least one P-type dopant (such as one or more of boron (B), aluminum (Al), and gallium (Ga)), carbon (C), fluorine (F), chlorine (Cl), bromine (Br), hydrogen (H), deuterium ($^2$H), helium (He), neon (Ne), and argon (Ar). In some embodiments, the replaceable structures 508 may comprise polysilicon.

Figure 6:
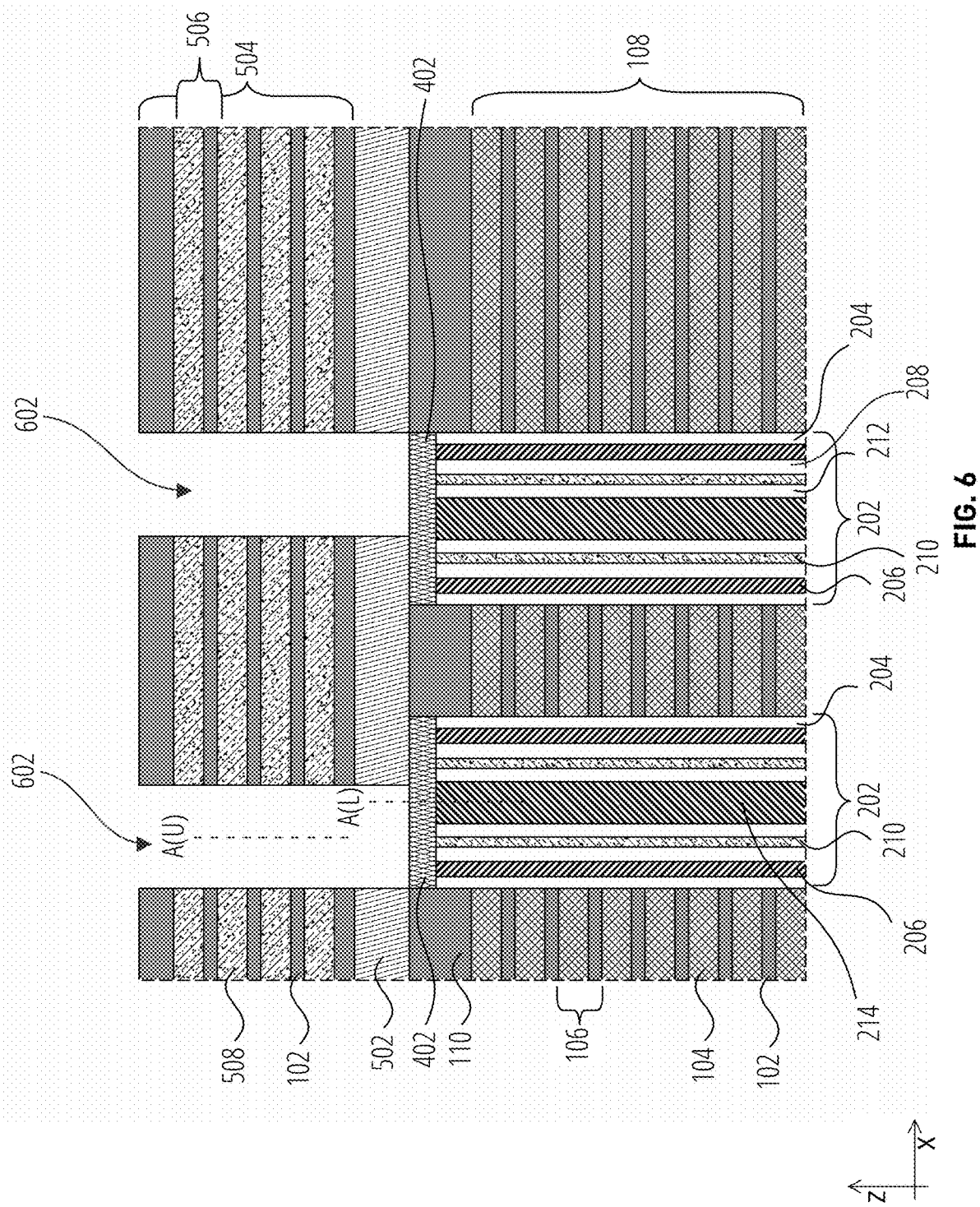

With reference to FIG. 6, after forming the upper stack 504, openings 602 may be formed (e.g., etched) through the upper stack 504 and through the etch stop material 502 to expose at least a portion of the sacrificial fill structures 402. A longitudinal axis A(U) of each of the openings 602 may be laterally offset from the longitudinal axis A(L) of the pillar structures 202 of the lower stack structure 108, and the horizontal width of the openings 602 may be less than a horizontal width of the pillar structures 202. As will be discussed further below, this configuration of the openings 602 in the upper stack 504, relative to the pillar structures 202 in the lower stack structure 108, enables an isolation trench to be subsequently formed through the upper stack 504.

Figure 7:
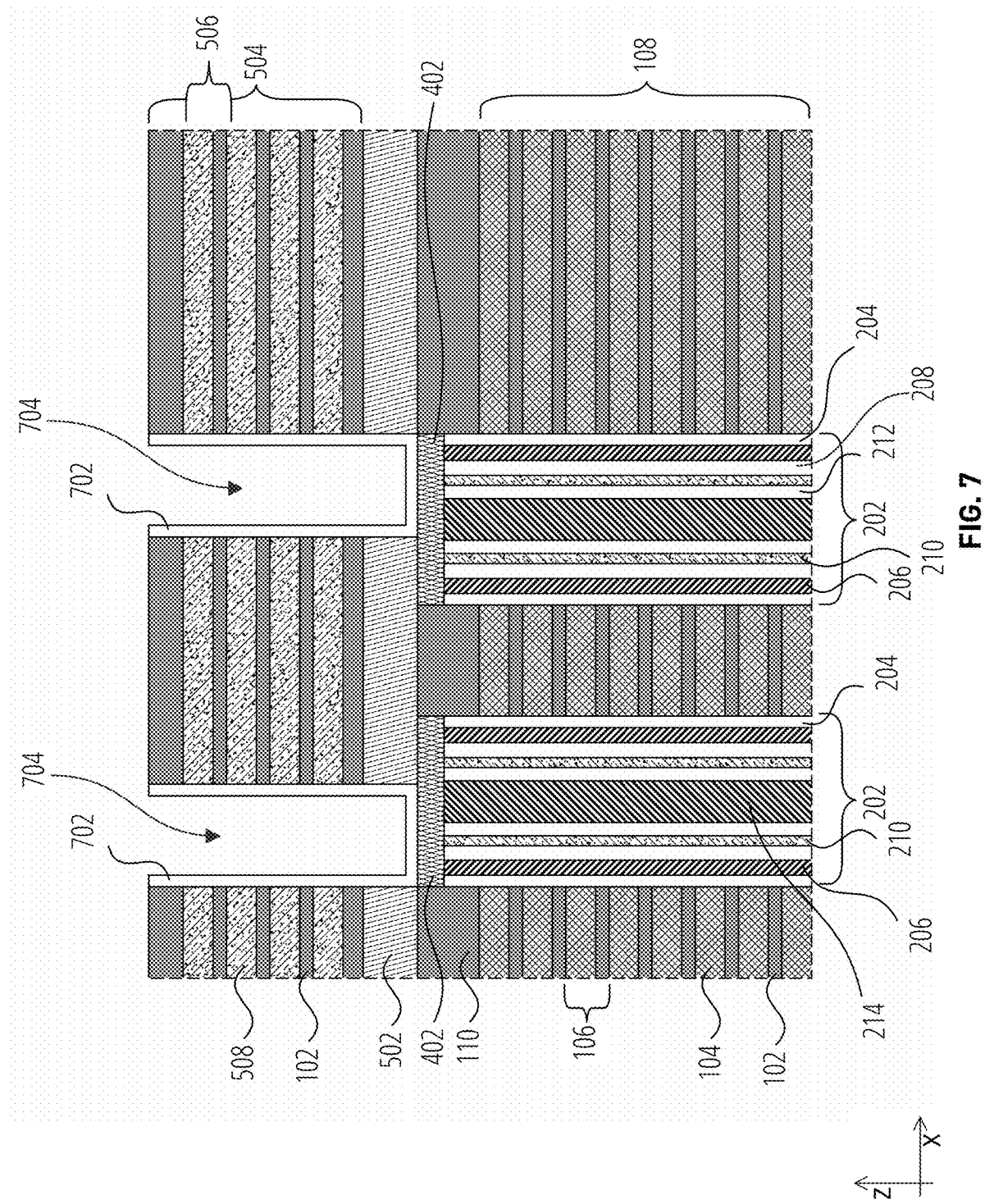

With reference to FIG. 7, a dielectric material 702 may then be formed (e.g., conformally deposited) over surfaces (e.g., sidewalls) of the openings 602 (FIG. 6) and on the exposed portion of the sacrificial fill structures 402. The dielectric material 702 may be formed of and include, for example, an insulative material, such as one or more of the materials described above with reference to the dielectric structure 212. In some embodiments, the dielectric material 702 comprises silicon dioxide. Openings 704 remain and are defined by the dielectric material 702.

Figure 8:
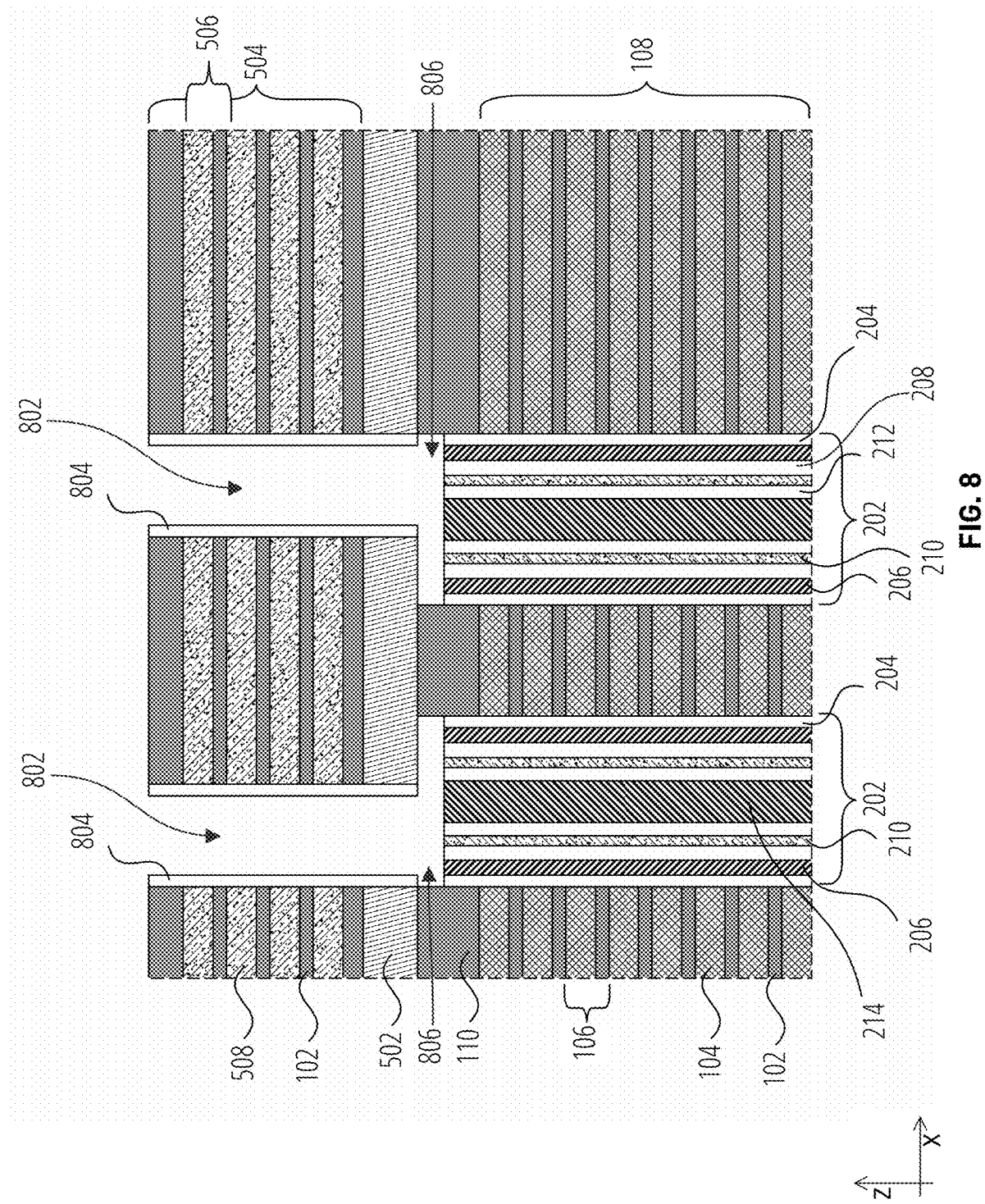

A lower surface of the dielectric material 702 may then be removed (e.g., anisotropically etched) to expose the sacrificial fill structures 402, and then the sacrificial fill structures 402 removed (e.g., exhumed), as illustrated in FIG. 8. This material removal leaves an opening 802 laterally bordered by a dielectric liner 804 comprising the remaining dielectric material 702 (FIG. 7), with a void 806 at the base of the opening 802. The void 806 may extend laterally under a part of the etch stop material 502. Therefore, the upper surfaces of the materials of the pillar structures 202 are exposed within the voids 806 and within the openings 802.

Figure 9:
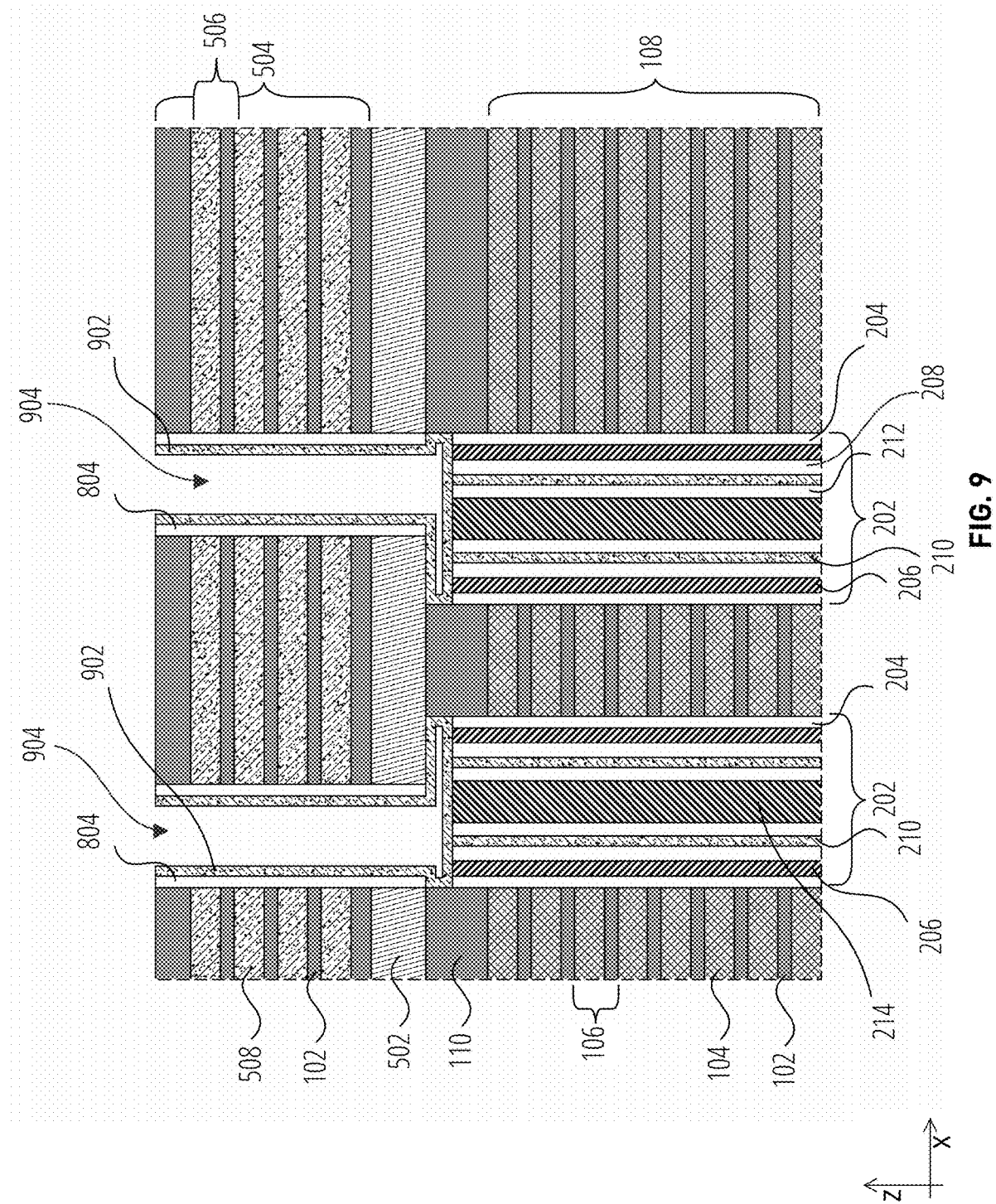

Within the openings 802, including the voids 806, an additional channel material 902 may then be formed (e.g., conformally formed) as illustrated in FIG. 9. The additional channel material 902 may be formed on (e.g., directly on) the exposed upper surface of the materials of the pillar structures 202. In other embodiments, the additional channel material 902 may be formed to—or may be subsequently etched to—be present only on the upper surface of the materials of the pillar structures 202 from the outer sidewall of the pillar structures 202 to and over the channel material 210. Regardless, the additional channel material 902 may be formed to be in direct physical contact with at least the channel material 210 and to extend upward through the upper stack 504. Through the upper stack 504, the dielectric liner 804 may be horizontally interposed between the tiers 506 of the upper stack 504 and the additional channel material 902. Forming the additional channel material 902 leaves openings 904 lined in part or in whole by the additional channel material 902.

The additional channel material 902 may be formed of and include one or more of the materials described above with reference to the channel material 210. In some embodiments, the additional channel material 902 may have the same composition as the channel material 210. In some such embodiments, both the channel material 210 and the additional channel material 902 may comprise a doped polysilicon. Together, the channel material 210 and the additional channel material 902 provide a channel structure (e.g., a doped hollow channel (DHC) structure) that extends through both the lower stack structure 108 (e.g., in the pillar structures 202) and through the upper stack 504, as well as through the etch stop material 502.

While FIG. 4 through FIG. 9 illustrate forming the channel structure of the channel material 210 and the additional channel material 902 by first forming the sacrificial fill structure 402 (FIG. 4), forming and removing a lower part of the dielectric material 702 (FIG. 7), and exhuming the sacrificial fill structures 402 before forming the additional channel material 902, in other embodiments the channel structure—and, particularly, the additional channel material 902 thereof—may be formed by other methods known in the art. Nonetheless, the resulting structure, such as that of FIG. 9, includes the additional channel material 902 extending through the upper stack 504 and in direct physical contact with the channel material 210 of the pillar structures 202 in the lower stack structure 108.

Figure 10:
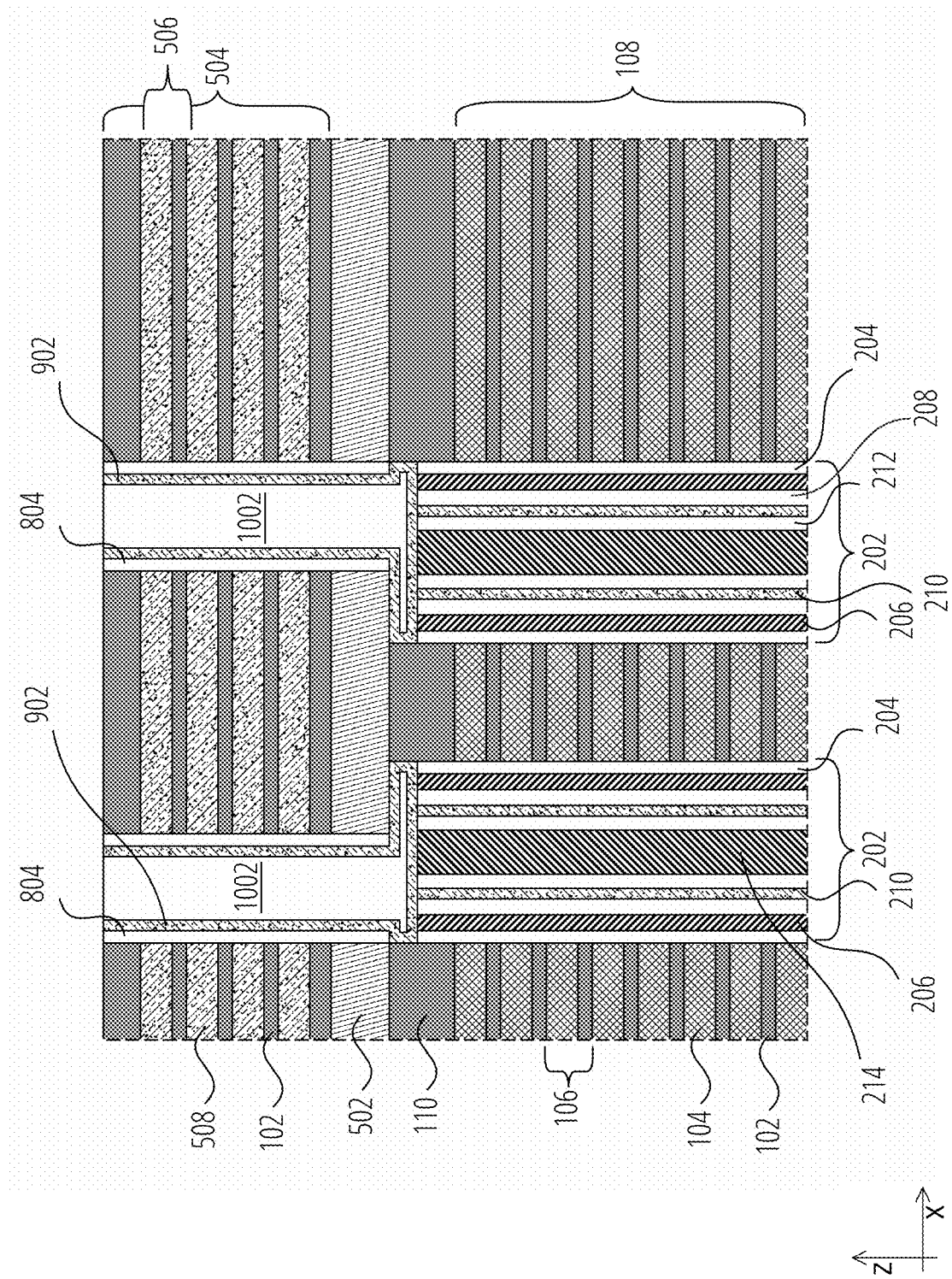

After forming the additional channel material 902, the openings 904 may then be filled by forming (e.g., depositing) a dielectric material 1002 therein, as illustrated in FIG. 10. The dielectric material 1002 may be formed of and include one or more of the materials described above with reference to the dielectric structure 212. In some embodiments, the dielectric material 1002 comprises the same material as the dielectric structure 212, the insulative material 214, and/or other insulative (e.g., dielectric materials) of the pillar structure 202. In some embodiments, the dielectric material 1002 comprises silicon dioxide.

Figure 11:
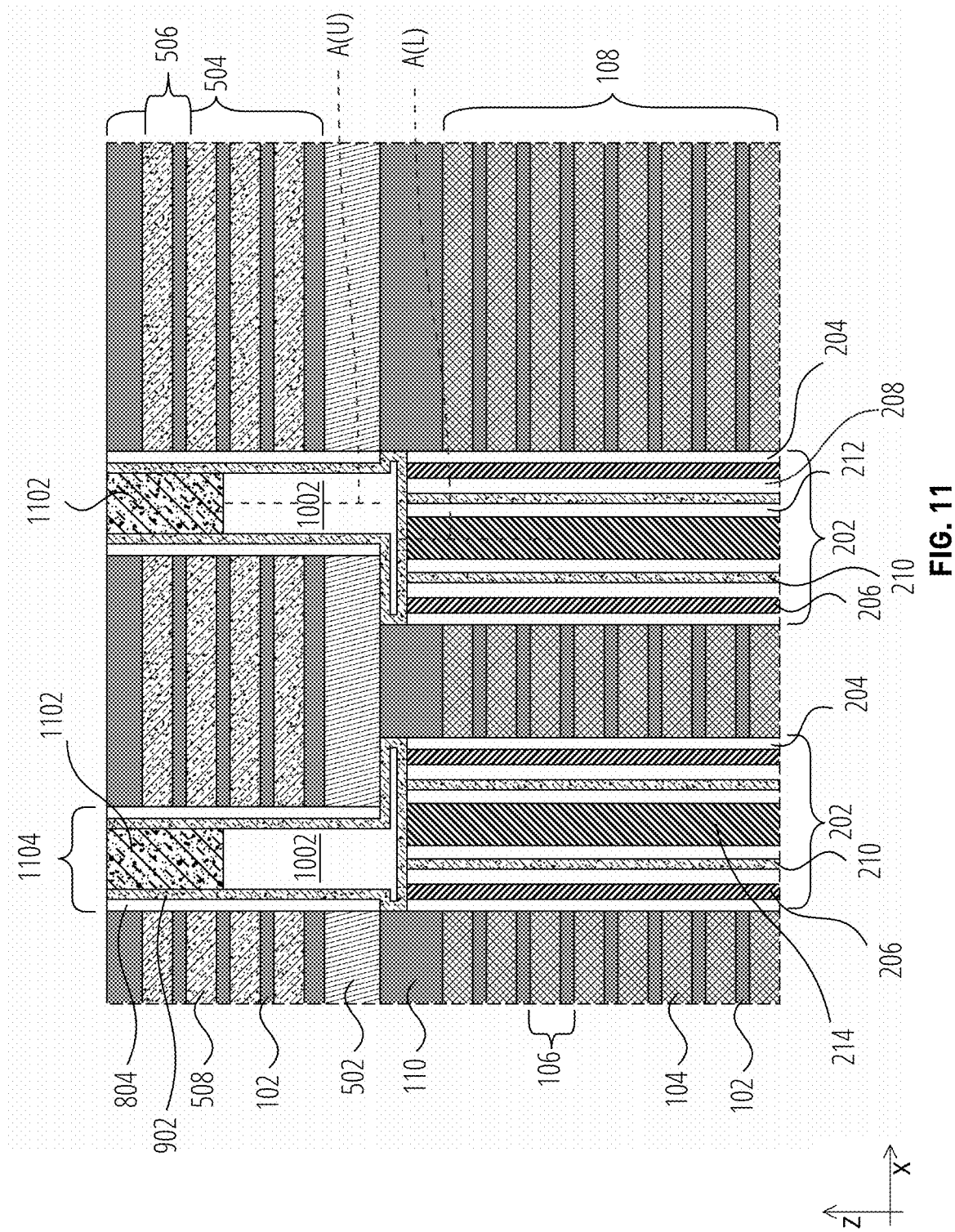

With reference to FIG. 11, the dielectric material 1002 may then be recessed by removing (e.g., etching) a portion of the dielectric material 1002. After the recessing, an upper surface of the dielectric material 1002 may be at an elevation below one or more of (e.g., two of) the replaceable structures 508 of the upper stack 504. A plug 1102 may then be formed in each recessed space. The plug 1102 may be formed of and include, e.g., a conductive polysilicon material (e.g., a doped polysilicon material). Thus formed in the upper stack 504 is an upper pillar structure 1104, which is disposed above a respective one of the pillar structures 202 of the lower stack structure 108.

The longitudinal centerline A(U) of the upper pillar structure 1104 may be laterally offset relative to the longitudinal centerline A(L) of the pillar structure 202. As illustrated in FIG. 11, the longitudinal centerlines A(U) of neighboring upper pillar structures 1104 may be laterally offset, relative to their respective pillar structures 202, in opposite directions. For example, the longitudinal centerline A(U) of a first upper pillar structure 1104 (e.g., the upper pillar structure 1104 illustrated on the left in FIG. 11) may be laterally offset to the left of the longitudinal centerline A(L) of its respective pillar structure 202, while a second upper pillar structure 1104 (e.g., the upper pillar structure 1104 illustrated on the right in FIG. 11) may be laterally offset to the right of the longitudinal centerline A(L) of its respective pillar structure 202. In other embodiments, each of the upper pillar structures 1104 may have a longitudinal centerline A(U) that is laterally offset from the longitudinal centerline A(L) of its respective pillar structure 202 in the same respective direction (e.g., all offset to the left or all offset to the right). The direction and amount of respective offset may be tailored to best accommodate subsequent formation of isolation trenches between the upper pillar structures 1104.

Figure 12:
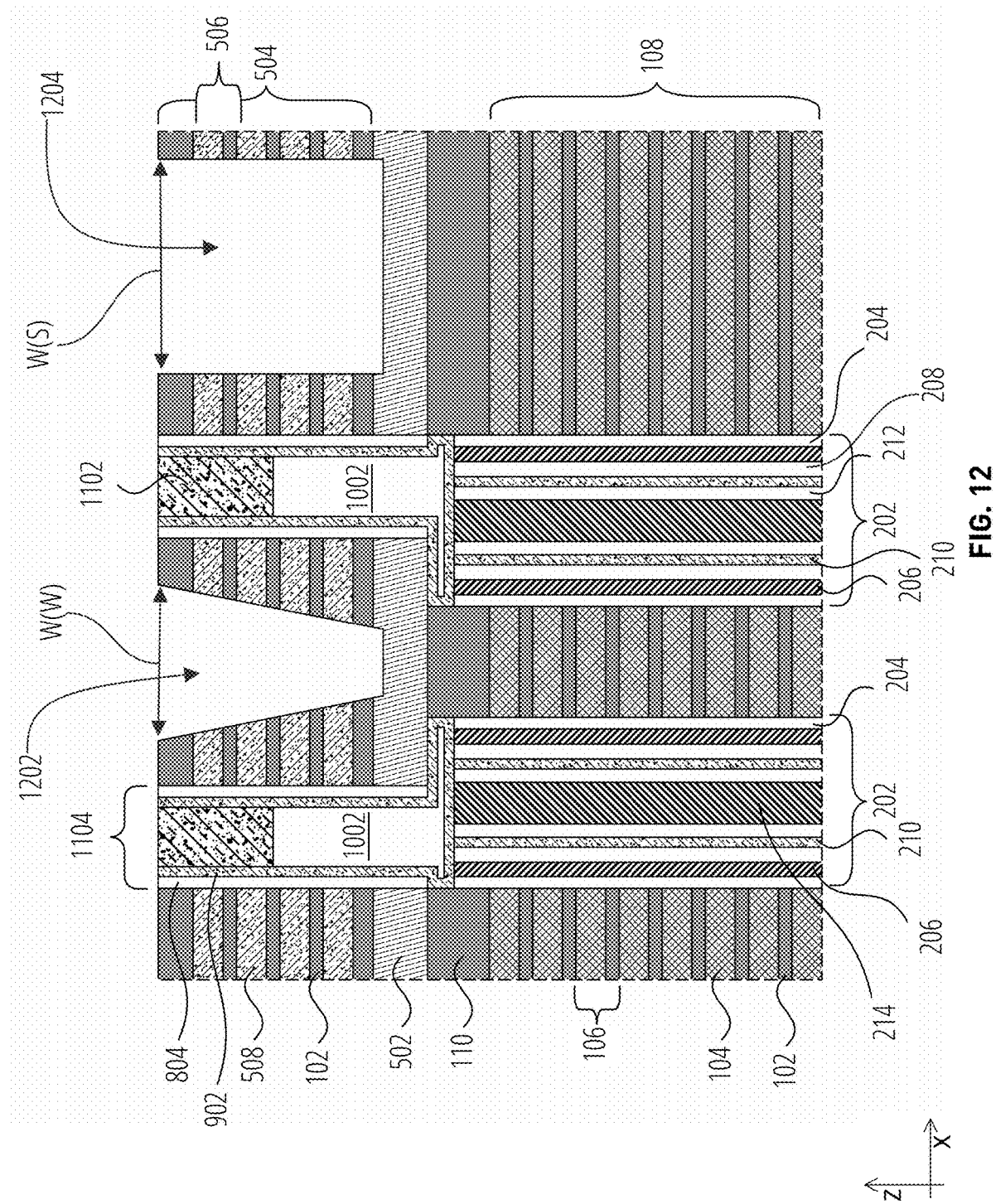

For example, with reference to FIG. 12, an isolation trench 1202 may be formed (e.g., etched) between neighboring upper pillar structures 1104, with the isolation trench 1202 extending at least through the upper stack 504 and stopping on or only partially into the etch stop material 502. As will be discussed further below, the isolation trenches 1202 may define a "weave" pattern, wherein sidewalls of the nonplanar. For example, the nonplanar sidewalls of the isolation trenches 1202 define a horizontal, cross-sectional periphery (e.g., in the X-Y plane) that is not substantially straight. The particular shape of the weave pattern for the isolation trenches 1202 may be defined according to avoid removing or exposing material of the upper pillar structures 1104 in the isolation trenches 1202.

At the stage of forming the isolation trenches 1202, no opening (e.g., slit) of void space may yet extend continuously through both the upper stack 504 and the lower stack structure 108. Accordingly, the isolation trenches 1202 may be formed at a stage of the fabrication process at which material expansion, block bending, or the like has not previously occurred, at least not significantly. Therefore, patterning and forming the isolation trenches 1202 may be carried out with more reliability, avoiding unintentional misalignment of the isolation trench 1202 that may otherwise cause unwanted removal of material from the upper pillar structures 1104.

In some embodiments, concurrent with or subsequent to forming the isolation trenches 1202, partial slit openings 1204 may also be formed through the tiers 506 of the upper stack 504 to define the uppermost portion of what will become a block-defining slit. Both the isolation trenches 1202 and the partial slit openings 1204 may be formed by removing the same materials, i.e., the materials of the insulative structures 102 and the replaceable structures 508 of the upper stack 504. Accordingly, the formation of the isolation trenches 1202 and the partial slit openings 1204 may include removal (e.g., etching) of select portions of only insulative material(s) (e.g., of the insulative structures 102) and, at least in some embodiments, semiconductor material(s) (e.g., of the replaceable structures 508), and not removal of metal materials. Therefore, the formation of the isolation trenches 1202 and the partial slit openings 1204 may avoid having to remove hard-to-etch materials, such as certain metals (e.g., tungsten, ruthenium). The same etchants may be used to form both the isolation trenches 1202 and the partial slit openings 1204. Prior to forming the isolation trenches 1202 and the partial slit openings 1204, a hardmask material may be formed over the structure of FIG. 11, and then patterned to define the location at which the isolation trenches 1202 and the partial slit openings 1204 are to be formed. Accordingly, during formation of the isolation trenches 1202 and the partial slit openings 1204, the material of the upper pillar structures 1104 may be covered and not exposed to the material-removal process (e.g., etchant).

For ease of illustration, the partial slit opening 1204 of FIG. 12 and other figures herein is illustrated to have a width that is only a little wider than that of the isolation trench 1202. However, in some embodiments, the partial slit opening 1204 may have a width W(S) that is significantly greater than a width W(W) of the isolation trench 1202. For example, the width W(W) of the isolation trench 1202 (e.g., at an uppermost elevation of the isolation trench 1202) may be within a range from about 30 nm to about 150 nm, such as from about 30 nm to about 50 nm, from about 50 nm to about 75 nm, from about 75 nm to about 100 nm, or from about 100 nm to about 150 nm, while the width W(S) of the partial slit openings 1204 (e.g., at an uppermost elevation of the partial slit openings 1204) may be in a range from about 100 nm to about 400 nm, such as from about 100 nm to about 200 nm, from about 200 nm to about 300 nm, or from about 300 nm to about 400 nm. In some embodiments, the width W(W) of the isolation trenches 1202 is about 35 nm to about 40 nm while the width W(S) of the partial slit opening 1204 is about 300 nm. In embodiments in which the partial slit openings 1204 are significantly wider than the isolation trenches 1202, sidewalls of the isolation trenches 1202 may be angled and less vertical than sidewalls of the partial slit openings 1204. However, the disclosure is not so limited and the width W(S) of the partial slit openings 1204 and the width W(W) of the isolation trenches 1202 may be different than those described.

Figure 13:
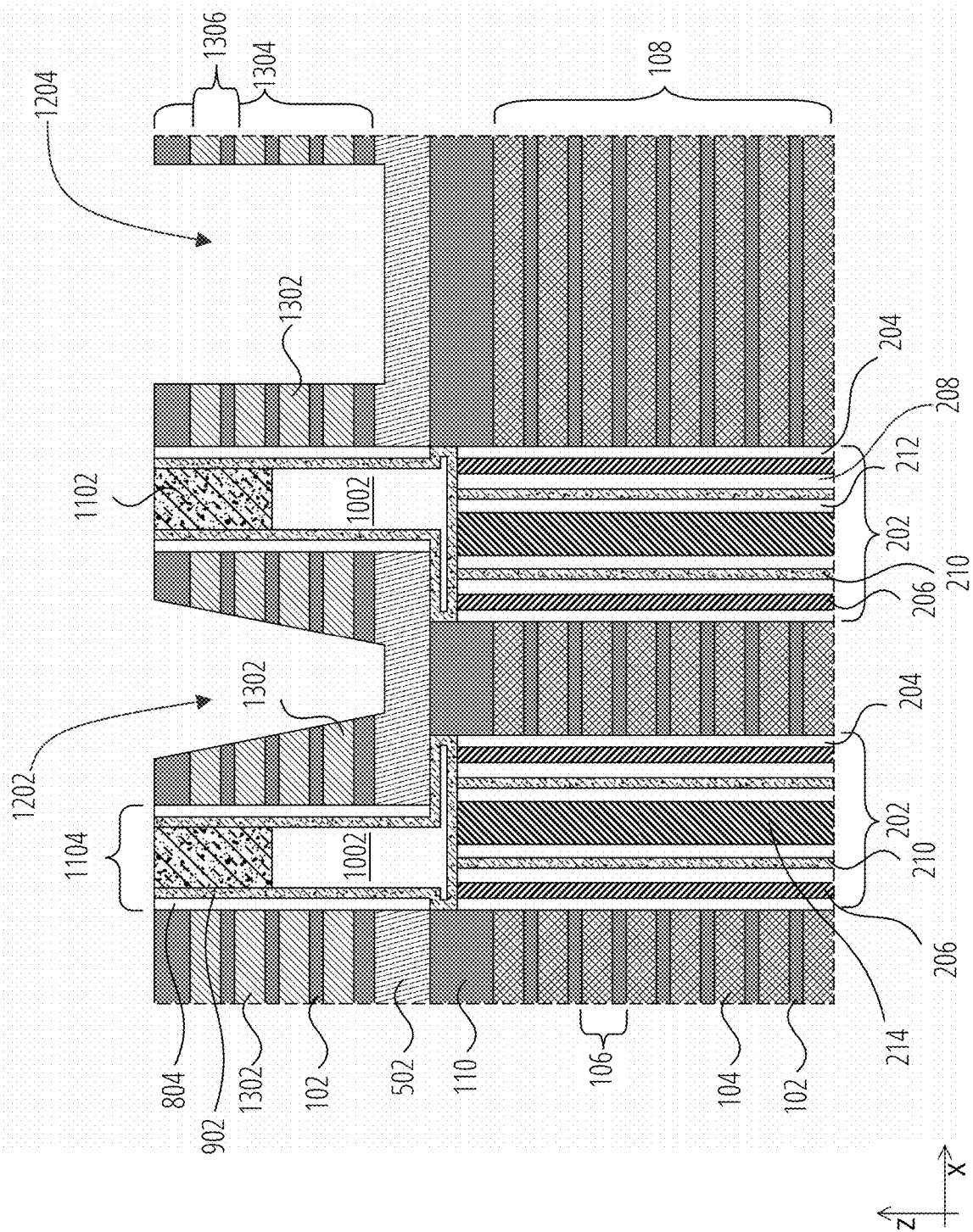

Subsequent to forming the isolation trenches 1202 and without yet forming an opening (e.g., trench) that extends and communicates through both the upper stack 504 and the lower stack structure 108, the replaceable structures 508 may be replaced with at least one conductive material to form conductive structures 1302, as illustrated in FIG. 13. Thus, the upper stack 504 (FIG. 12) is converted into an additional stack 1304 that includes tiers 1306 of vertically alternating insulative structures 102 and conductive structures 1302.

At least a portion of the replaceable structures 508 (FIG. 12) may be replaced with at least one electrically conductive material to form conductive structures 1302. In some embodiments, at least a portion of the replaceable structure 508 is replaced by the electrically conductive material of the conductive structures 1302 by chemically converting at least a portion of the replaceable material of the replaceable structures 508 into the electrically conductive material of the conductive structures 1302. By way of non-limiting example, the material of the replaceable structures 508 may be treated with one or more chemical species facilitating the conversion of the material (e.g., silicon material, polysilicon material) of the replaceable structures 508 into tungsten (e.g., 3-phase tungsten, α-phase tungsten). The isolation trenches 1202 and the partial slit openings 1204 enable the replaceable structures 508 to be exposed to the chemical species for the material conversion.

By way of non-limiting example, if the replaceable structures 508 comprise a doped silicon material (e.g., doped polycrystalline silicon), the material of the replaceable structures 508 may be treated with tungsten hexafluoride ($WF_6$) to form tungsten as the electrically conductive material of the conductive structures 1302. In some such embodiments, silicon (Si) of the material of the replaceable structures 508 may react with the $WF_6$ to produce tungsten (W) and silicon tetrafluoride ($SiF_4$). The produced $SiF_4$ may be removed as a gas. The produced W remains with any dopant(s) of the material of the replaceable structures 508 to form the conductive structures 1302. The replaceable structures 508 may, for example, be treated with $WF_6$ using a conventional CVD apparatus at a temperature within a range of from about 200° C. to about 500° C. Accordingly, the resulting conductive structures 1302 may occupy the space previously occupied by the replaceable structures 508 (FIG. 12). The conductive material of the conductive structures 1302 may extend directly between neighboring insulative structures 102, e.g., without a liner material or other distinctive region between the conductive material of the conductive structures 1302 and the insulative structures 102. Likewise, the conductive material of the conductive structures 1302 may be in direct physical contact with the dielectric liner 804 of the upper pillar structures 1104, e.g., without a liner material or other distinctive region between the conductive material of the conductive structures 1302 and the dielectric liner 804.

Forming the conductive structures 1302 by converting the material of the replaceable structures 508 to the electrically conductive material may form the conductive structures 1302 only where the replaceable structures 508 had been disposed, such that—during formation of the conductive material of the conductive structures 1302—the electrically conductive material may not extend into the isolation trenches 1202 or the partial slit openings 1204. Accordingly, a subsequent material-removal process to ensure electrical isolation of neighboring conductive structures 1302 may be avoided.

By forming the conductive structures 1302 through the aforementioned material-conversion process, the material of the conductive structures 1302 comprises tungsten. In some embodiments, the conductive structures 1302 comprise β-phase tungsten. β-phase tungsten has a metastable, A15 cubic structure. Grains of the β-phase tungsten may exhibit generally columnar shapes. Tungsten included within the conductive structures 1302 may be present in only the β-phase or may be present in the β-phase and in the alpha (α) phase. If present, the α-phase tungsten has a metastable, body-centered cubic structure. Grains of the α-phase tungsten may exhibit generally isometric shapes. If the conductive structures 1302 include β-phase tungsten and α-phase tungsten, an amount of β-phase tungsten included in the conductive structures 1302 may be different than an amount of α-phase tungsten included in the conductive structures 1302, or it may be substantially the same as amount of α-phase tungsten included in the conductive structures 1302. In some embodiments, an amount of β-phase tungsten included in the conductive structures 1302 is greater than an amount of α-phase tungsten included in the conductive structures 1302. For example, at least a majority (e.g., greater than 50 percent by volume, such as greater than or equal to about 60 percent by volume, greater than or equal to about 70 percent by volume, greater than or equal to about 80 percent by volume, greater than or equal to about 90 percent by volume, greater than or equal to about 95 percent by volume, or greater than or equal to about 99 percent) of the tungsten included in the conductive structures 1302 may be present in the β-phase. In embodiments where the replaceable structures 508 (FIG. 12) included one or more dopants, the conductive structures 1302 may include tungsten and the one or more dopants.

The conductive structures 1302 may comprise and be configured as so-called "select gate structures" (e.g., select gate drains (SGD), select drain structures (SDS)). As will be described herein, the conductive structures 1302 may be used for selecting memory cells of a particular string of memory cells. Although FIG. 12 illustrates four conductive structures 1302 in the upper stack 504, the disclosure is not so limited. Any number of the conductive structures 1302—such as fewer than four conductive structures 1302 (e.g., one, two, three) or greater than four conductive structures 1302 (e.g., five, six, seven, eight, or more) may be included in the upper stack 504.

Figure 14:
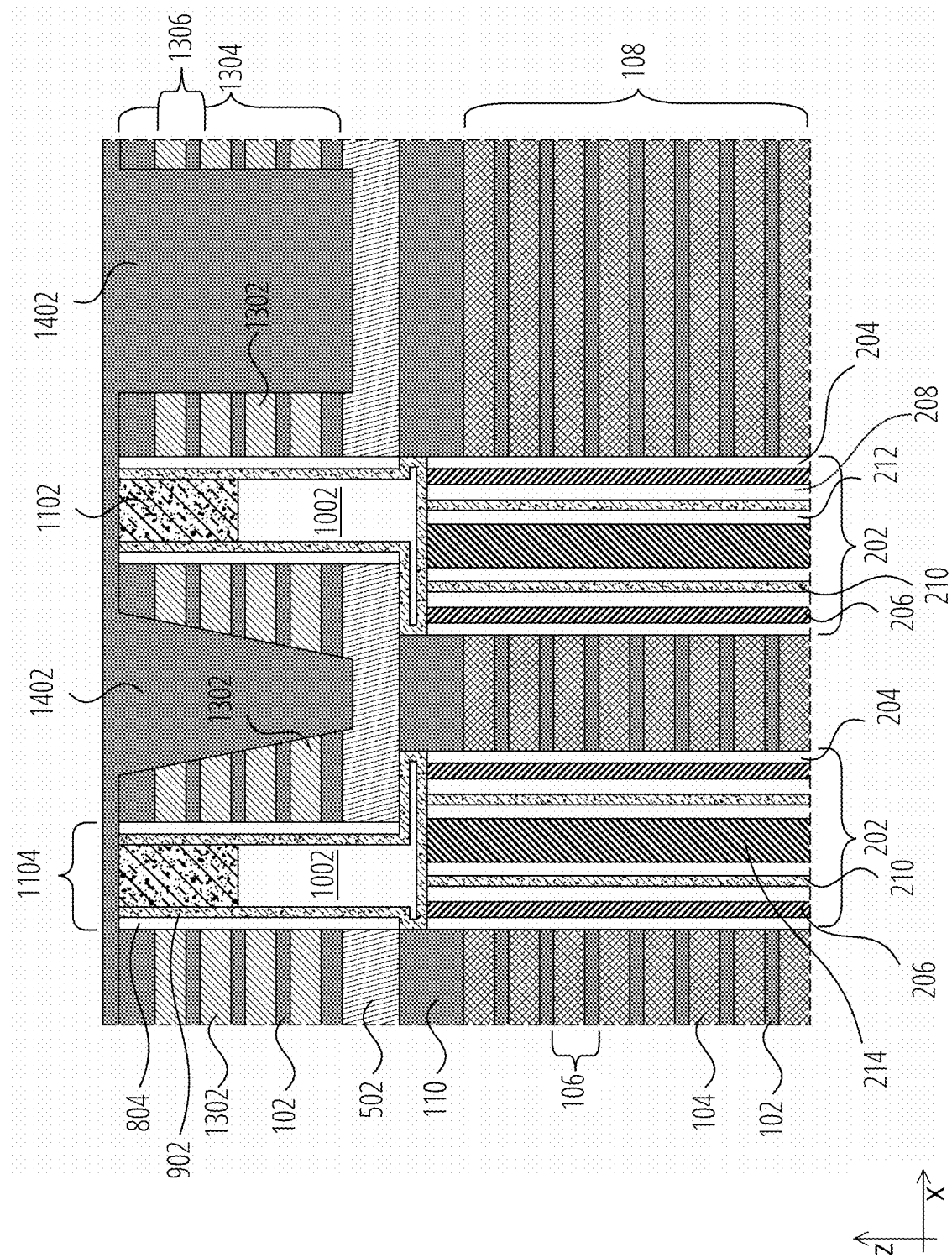

After replacing (e.g., converting) at least a portion of the replaceable structures 508 (FIG. 12) with the conductive structures 1302, the isolation trenches 1202 and the partial slit openings 1204 may be filled, as illustrated in FIG. 14. For example, a fill material 1402 (e.g., a dielectric material) may be formed (e.g., deposited) to fill and, optionally, overfill the isolation trenches 1202 and the partial slit openings 1204 (FIG. 13). In embodiments in which a hardmask is still present over the upper pillar structures 1104 through formation of the isolation trenches 1202 and the partial slit openings 1204, the fill material 1402 may be formed to overlay the hardmask as well as to fill the isolation trenches 1202 and the partial slit openings 1204.

The fill material 1402 may be formed of and include an electrically insulative material, e.g., one or more of phosphosilicate glass (PSG), borosilicate glass (BSG), fluorosilicate glass (FSG), borophosphosilicate glass (BPSG), and silicon dioxide. In some embodiments, the fill material 1402 comprises silicon dioxide.

Figure 15:
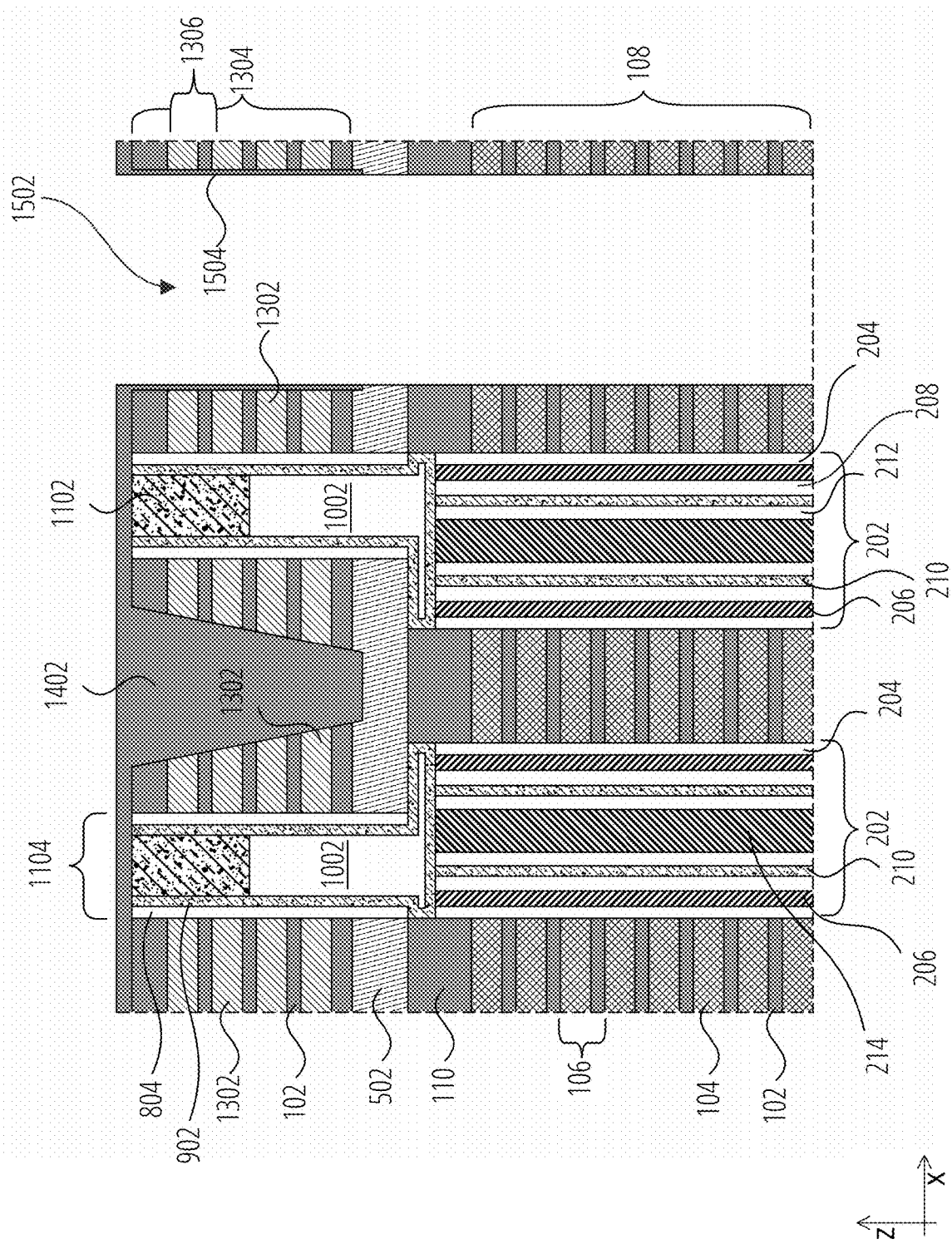
Figure 16:
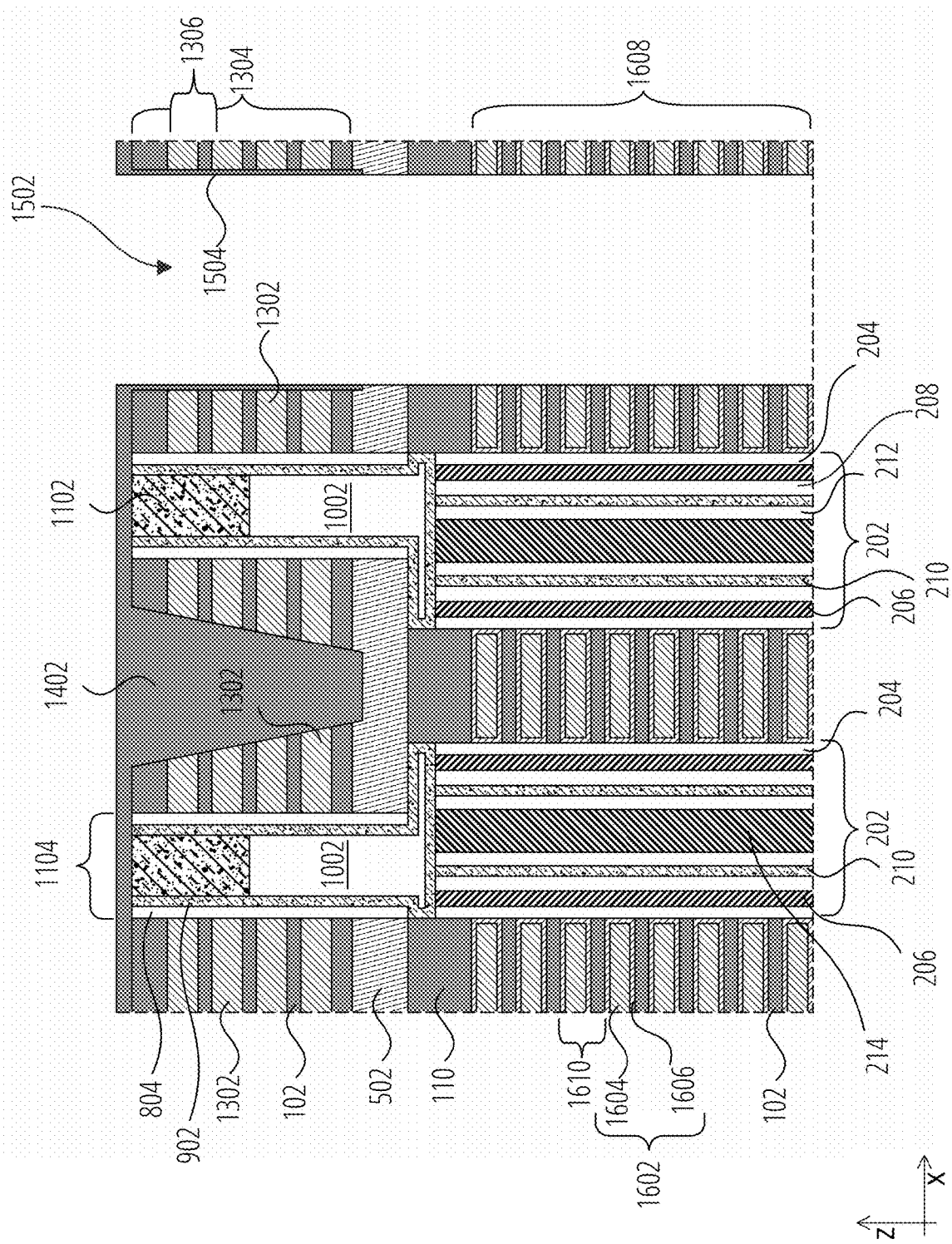

With reference to FIG. 15, a slit 1502 may then be formed (e.g., etched) through the fill material 1402 that was formed in the partial slit openings 1204 (FIG. 13) and also formed through the etch stop material 502, the dielectric material 110, and the lower stack structure 108. Effectively, forming the slit 1502 extends the partial slit opening 1204 (FIG. 13) previously formed. In embodiments in which a source structure underlies the lower stack structure 108, the slit 1502 may expose a portion of the source structure. Each slit 1502 may be formed to effectively divide the structure into "blocks," which are further discussed below. In contrast to the sidewalls that define the isolation trenches 1202 (FIG. 12), the sidewalls that define the slits 1502 may be substantially planar (e.g., the horizontal cross-section periphery of the slits 1502, in the X-Y plane, may be substantially straight). The slit 1502 may be patterned and formed to leave a liner 1504 of the fill material 1402 on sidewalls of the tiers 1306 of the additional stack 1304. In other embodiments, the fill material 1402 may be fully removed from sidewalls of the tiers 1306, such that no liner 1504 may be present adjacent the slit 1502 in the elevations of the additional stack 1304.

In some embodiments, forming the slits 1502 may not require substantial removal of hard-to-etch materials through the additional stack 1304 or the lower stack structure 108. Substantially only the fill material 1402 may be removed in the elevations of the additional stack 1304, and no conductive materials may be present in the materials of the lower stack structure 108 that are etched to form the slit 1502.

Because, at the time of forming the slit 1502, the conductive structures 1302 have already been formed in the additional stack 1304, the conductive structures 1302 may exhibit a material strength or material stresses that avoid material expansions or residual stresses that may otherwise cause "block bending" upon forming of the slits 1502.

The slits 1502 expose the material of the sacrificial structures 104 of the tiers 106 of the lower stack structure 108. Therefore, via the slits 1502, at least a portion of the material of the sacrificial structures 104 may be removed and replaced with conductive material(s) to form conductive structures 1602. The sacrificial structures 104 may be removed through the slits 1502 as part of a so-called "replacement gate" or "gate last" process. By way of non-limiting example, the sacrificial structures 104 may be removed by exposing the sacrificial structures 104 to a wet etchant comprising one or more of phosphoric acid, sulfuric acid, hydrochloric acid, nitric acid, or another material. In some embodiments, the sacrificial structures 104 are removed by exposing the sacrificial structures 104 to a so-called "wet nitride strip" comprising a wet etching comprising phosphoric acid.

After removing the sacrificial structures 104, the conductive structures 1602 may be formed between adjacent insulative structures 102 at locations corresponding to the locations of the sacrificial structures 104. Forming the conductive structures 1602 may include forming conductive material 1604 within a conductive liner 1606. That is, the conductive liner 1606 may be formed (e.g., conformally deposited) on surfaces of the insulative structures 102 and on exposed portions of the charge-blocking structure 204 of the pillar structures 202. Then, the conductive material 1604 may be formed on the conductive liner 1606. The conductive liner 1606 may be formulated to be a seed material from which the conductive material 1604 may be formed. A resulting lower stack structure 1608 with the insulative structures 102 vertically interleaved with conductive structures 1602 formed in tiers 1610.

The conductive structures 1602 may be formed of and include electrically conducive material, such as at least one electrically conductive material (e.g., a metal (e.g., tungsten, titanium, nickel, platinum, rhodium, ruthenium, iridium, aluminum, copper, molybdenum, silver, gold), a metal alloy (e.g., an alloy of one or more of the aforementioned metals), a metal-containing material that includes one or more of the aforementioned metals (e.g., metal nitrides, metal silicides, metal carbides, metal oxides, such as a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), a conductively-doped semiconductor material (e.g., conductively-doped silicon, conductively-doped germanium, conductively-doped silicon germanium, etc.), polysilicon, other materials exhibiting electrical conductivity, or combinations thereof). In some embodiments, the conductive material 1604 comprises at least one of the aforementioned metals and the conductive liner 1606 comprises at least one of the aforementioned metal-containing materials. For example, in some embodiments, the conductive structures 1602 include the conductive material 1604 formed of tungsten and include the conductive liner 1606 formed of tungsten nitride. Accordingly, in some embodiments, the conductive structures 1602 of the lower stack structure 1608 comprise a different material composition or microstructure than the conductive structures 1302 of the additional stack 1304. For example, the conductive structures 1602 may include a liner (e.g., the conductive liner 1606) while the conductive structures 1302 may not include a liner. Additionally or alternative, in some embodiments, both the conductive structures 1602 and the conductive structures 1302 comprise tungsten, but the tungsten of the conductive structures 1602 (e.g., of the conductive material 1604 of the conductive structures 1602) may have a different microstructure than the tungsten of the conductive structures 1302.

After forming the conductive structures 1602, the slits 1502 may be filled and the structure planarized to expose the upper pillar structures 1104, to form a microelectronic device structure 1700 as illustrated in FIG. 17. For example, a dielectric material 1702 may be formed to fill the slits 1502 (FIG. 16) and form slit structures 1706 extending vertically through the lower stack structure 1608, the dielectric material 110, the etch stop material 502, and the additional stack 1304. The dielectric material 1702 may be formed of and include one or more of the materials described above with reference to the dielectric structure 212. For example, the dielectric material 1702 may be formed of and include one or more of phosphosilicate glass (PSG), borosilicate glass (BSG), fluorosilicate glass (FSG), borophosphosilicate glass (BPSG), and silicon dioxide. In some embodiments, the dielectric material 1702 comprises the same material composition as the dielectric structure 212. In some embodiments, the dielectric material 1702 comprises silicon dioxide.

Formation of the conductive structures 1602 may form strings 1708 of memory cells 1710, the memory cells 1710 being located at intersections of the channel material 210 and the conductive structures 1602. Vertically adjacent memory cells 1710 of the strings 1708 may be separated from each other by one of the levels of the insulative structures 102.

After forming the dielectric material 1702, the microelectronic device structure 1700 may be completed by, for example, forming conductive lines (e.g., access lines, such as bit lines or digit lines) in electrical communication with the upper pillar structures 1104. In some embodiments, the conductive lines are formed directly over the upper pillar structures 1104. In such embodiments, because the conductive structures 1302 of the additional stack 1304 are formed prior to forming the slits 1502, such that "block bending" may be avoided or inhibited, conductive lines may be formed with more reliable contact to the upper pillar structures 1104, even with the isolation trenches 1704 formed close to the upper pillar structures 1104. That is, by avoiding or inhibiting block bending, the physical disposition of the upper pillar structures 1104 may be less prone to shift laterally, making forming subsequent contacts to the upper pillar structures 1104 more reliable.

FIG. 18 illustrates a top-down, plan, simplified view of the microelectronic device structure 1700 of FIG. 17, wherein the view of FIG. 17 is taken along section line B-B of FIG. 18. For ease of illustration, only the outermost edge of the pillar structures 202 (where not overlapped by the fill material 1402 of the isolation trenches 1704), of the upper pillar structures 1104, of the isolation trenches 1704, and of the slit structures 1706 are illustrated to illustrate the relative dispositions of these features of the microelectronic device structure 1700.

The isolation trenches 1704 may pass between columns of the upper pillar structures 1104 and provide electrical isolation between neighboring upper pillar structures 1104. The isolation trenches 1704 may be formed to define a "weave" pattern, in that vertical sidewalls of the isolation trenches 1704 do not define planar walls or consistent angles along the X-Y plane. In some of these embodiments, however, the width W(W) of the isolation trenches 1704 may remain consistent as the isolation trenches 1704 weaves around upper pillar structures 1104. The slit structures 1706 may define substantially planar sidewalls such that the lateral edges of the 1706 define a substantially consistent angle along the X-Y plane. The slit structures 1706 also divide the microelectronic device structure 1700 into blocks 1802.

In other embodiments, the microelectronic device structure 1700 may include upper pillar structures 1104, and optionally also pillar structures 202, that are offset from one another in the X-Y plane without defining a straight line between the upper pillar structures 1104 of one column or row. Accordingly, the isolation trenches 1704 may be formed in the so-called "weave pattern" about the upper pillar structures 1104 to facilitate increased density of the upper pillar structures 1104, and therefore also the respective pillar structures 202, in the microelectronic device structure 1700.

Accordingly, disclosed is a method of forming a microelectronic device. The method comprises forming a lower stack structure comprising a first vertically alternating sequence of first insulative structures and sacrificial structures arranged in tiers. A lower pillar structure, extending through the lower stack structure, is formed. The lower pillar structure comprises a channel material. An upper stack structure is formed above the lower stack structure. The upper stack structure comprises a second vertically alternating sequence of second insulative structures and replaceable structures arranged in tiers. An upper pillar structure, extending through the upper stack structure, is formed. The upper pillar structure comprises additional channel material. An opening is formed to extend through the upper stack structure. After forming the opening, at least a portion of the replaceable structures is replaced with a conductive material. A slit, extending through the upper stack structure and through the lower stack structure, is formed after replacing the at least the portion of the replaceable structures with the conductive material. After forming the slit, at least a portion of the sacrificial structures is replaced with a conductive liner and another conductive material within the conductive liner.

Also, in accordance with the foregoing, disclosed is a microelectronic device. The microelectronic device comprises pillar structures. A pillar structure, of the pillar structures, comprises a lower stack structure, an upper stack structure above the lower stack structure, a lower pillar structure extending through the lower stack structure, and an upper pillar structure extending through the upper stack structure. The lower stack structure comprises a first vertically alternating sequence of first insulative structures and first conductive structures arranged in tiers. The first conductive structures comprise a conductive liner material and a conductive material within the conductive liner material. The upper stack structure comprises a second vertically alternating sequence of second insulative structures and second conductive structures arranged in tiers. The second conductive structures comprise an additional conductive material and no liner material. The lower pillar structure comprises a channel material. The upper pillar structure has a longitudinal centerline laterally offset from a longitudinal centerline of the lower pillar structure. An isolation trench, defined in the upper stack structure, is between neighboring pillar structures of the pillar structures. The isolation trench has nonplanar sidewalls.

Further, in accordance with the foregoing, disclosed is a method of forming a microelectronic device. The method comprises forming pillar structures extending through a stack of materials. Forming the pillar structures comprises forming a lower stack structure comprising a vertically alternating sequence of insulative structures and sacrificial structures arranged in tiers; forming lower pillar structures extending through the lower stack structure, the lower pillar structures comprising a channel material; forming an upper stack structure above the lower stack structure and above the lower pillar structures, the upper stack structure comprising a vertically alternating sequence of additional insulative structures and replaceable structures arranged in tiers; and forming upper pillar structures extending through the upper stack structure, the upper pillar structures comprising additional channel material in direct physical contact with the channel material of the lower pillar structures. At least one opening is formed through the upper stack structure, between neighboring upper pillar structures of the upper pillar structures, to expose the replaceable structures. The replaceable structures are converted into conductive structures. After converting the replaceable structures into the conductive structures, a slit is formed through the upper stack structure and through the lower stack structure to expose the sacrificial structures. The sacrificial structures are replaced with a conductive material and a conductive liner material.

Figure 19:
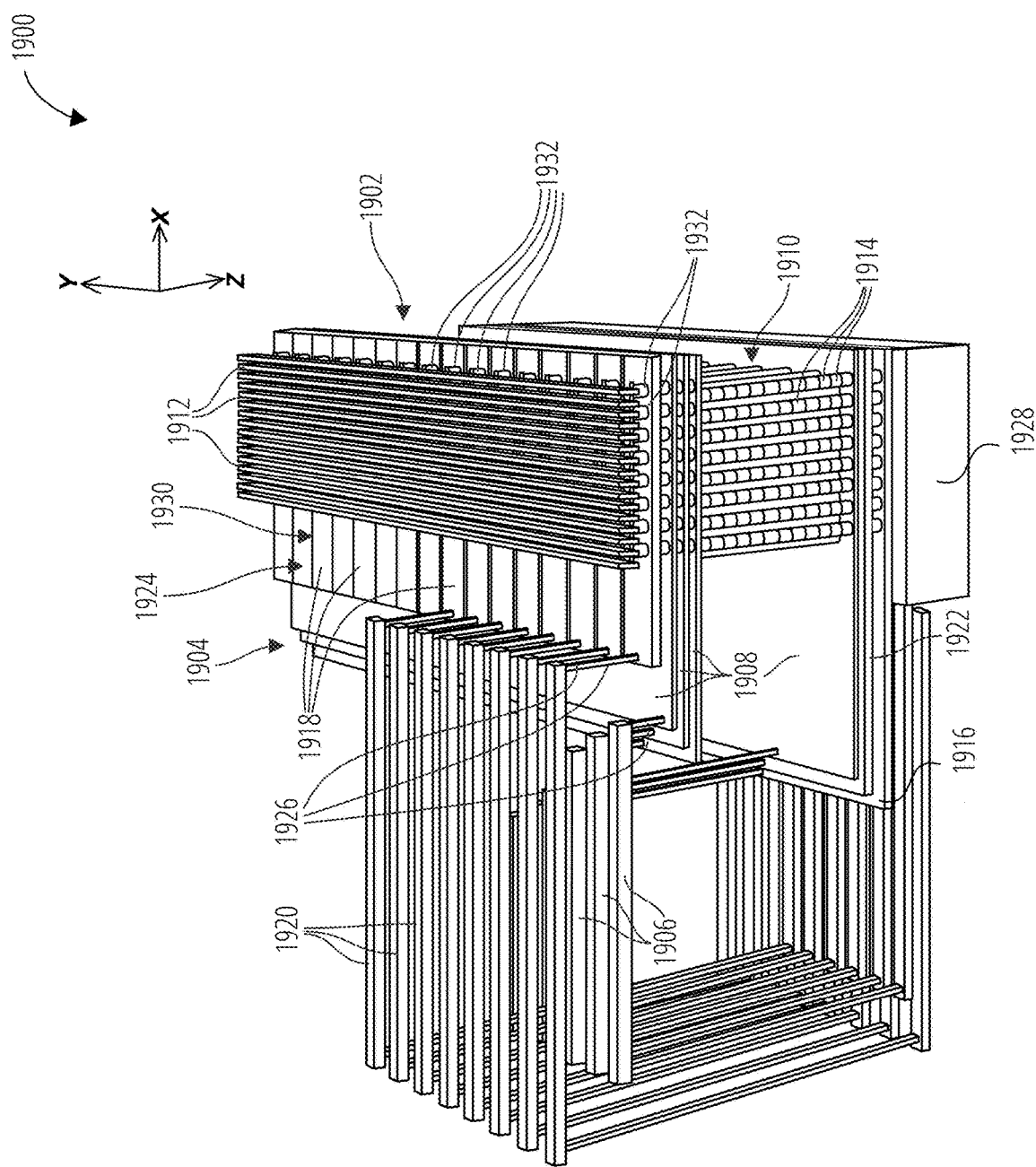
FIG. 19 is a partial, cutaway, perspective, schematic illustration of a microelectronic device, in accordance with embodiments of the disclosure.

FIG. 19 illustrates a partial cutaway, perspective, schematic illustration of a portion of a microelectronic device 1900 (e.g., a memory device, such as a dual deck 3D NAND Flash memory device) including a microelectronic device structure 1902. The microelectronic device structure 1902 may be substantially similar to the microelectronic device structure 1700 previously described with reference to FIG. 17 and FIG. 18. As illustrated in FIG. 19, the microelectronic device structure 1902 may include a staircase structure 1904 defining contact regions for connecting access lines 1906 to conductive tiers 1908 (e.g., conductive layers, conductive plates, such as the conductive structures 1602 (FIG. 16)). The microelectronic device structure 1902 may include vertical strings 1910 (e.g., strings 1708 (FIG. 17)) of memory cells 1914 (e.g., memory cells 1710 (FIG. 17)) that are coupled to each other in series. The vertical strings 1910 may extend vertically (e.g., in the Z-direction) and orthogonally to conductive tiers 1908, such as data lines 1912, a source tier 1916 (e.g., a source structure below the lower stack structure 1608 of FIG. 17), the access lines 1906, first select gates 1918 (e.g., upper select gates, drain select gates (SGDs), such as the conductive structures 1302 ((FIG. 17)), select lines 1920, and a second select gate 1922 (e.g., a lower select gate, a source select gate (SGS)). The first select gates 1918 may be horizontally divided (e.g., in the Y-direction) into multiple blocks 1924 (e.g., blocks 1802 (FIG. 18)) horizontally separated (e.g., in the Y-direction) from one another by slits 1930 (e.g., the slit structures 1706 (FIG. 17 and FIG. 18)).

Vertical conductive contacts 1926 may electrically couple components to each other, as illustrated. For example, the select lines 1920 may be electrically coupled to the first select gates 1918 and the access lines 1906 may be electrically coupled to the conductive tiers 1908. The microelectronic device 1900 may also include a control unit 1928 positioned under the memory array, which may include at least one of string driver circuitry, pass gates, circuitry for selecting gates, circuitry for selecting conductive lines (e.g., the data lines 1912, the access lines 1906), circuitry for amplifying signals, and circuitry for sensing signals. The control unit 1928 may be electrically coupled to the data lines 1912, the source tier 1916, the access lines 1906, the first select gates 1918, and the second select gates 1922, for example. In some embodiments, the control unit 1928 includes CMOS (complementary metal-oxide-semiconductor) circuitry. In such embodiments, the control unit 1928 may be characterized as having a "CMOS under Array" ("CuA") configuration.

The first select gates 1918 may extend horizontally in a first direction (e.g., the X-direction) and may be coupled to respective first groups of vertical strings 1910 of memory cells 1914 at a first end (e.g., an upper end) of the vertical strings 1910. The second select gate 1922 may be formed in a substantially planar configuration and may be coupled to the vertical strings 1910 at a second, opposite end (e.g., a lower end) of the vertical strings 1910 of memory cells 1914.

The data lines 1912 (e.g., bit lines) may extend horizontally in a second direction (e.g., in the Y-direction) that is at an angle (e.g., perpendicular) to the first direction in which the first select gates 1918 extend. The data lines 1912 may be coupled to respective second groups of the vertical strings 1910 at the first end (e.g., the upper end) of the vertical strings 1910. A first group of vertical strings 1910 coupled to a respective first select gate 1918 may share a particular vertical string 1910 with a second group of vertical strings 1910 coupled to a respective data line 1912. Thus, a particular vertical string 1910 may be selected at an intersection of a particular first select gate 1918 and a particular data line 1912. Accordingly, the first select gates 1918 may be used for selecting memory cells 1914 of the vertical strings 1910 of memory cells 1914.

The conductive tiers 1908 (e.g., word line plates) may extend in respective horizontal planes. The conductive tiers 1908 may be stacked vertically, such that each conductive tier 1908 is coupled to all of the vertical strings 1910 of memory cells 1914, and the vertical strings 1910 of the memory cells 1914 extend vertically through the stack of conductive tiers 1908. The conductive tiers 1908 may be coupled to or may form control gates of the memory cells 1914 to which the conductive tiers 1908 are coupled. Each conductive tier 1908 may be coupled to one memory cell 1914 of a particular vertical string 1910 of memory cells 1914.

The first select gates 1918 and the second select gates 1922 may operate to select a particular vertical string 1910 of the memory cells 1914 between a particular data line 1912 and the source tier 1916. Thus, a particular memory cell 1914 may be selected and electrically coupled to a data line 1912 by operation of (e.g., by selecting) the appropriate first select gate 1918, second select gate 1922, and conductive tier 1908 that are coupled to the particular memory cell 1914.

The staircase structure 1904 may be configured to provide electrical connection between the access lines 1906 and the conductive tiers 1908 through the vertical conductive contacts 1926. In other words, a particular level of the conductive tiers 1908 may be selected via one of the access lines 1906 that is in electrical communication with a respective one of the conductive contacts 1926 in electrical communication with the particular conductive tier 1908.

The data lines 1912 may be electrically coupled to the vertical strings 1910 through conductive structures 1932 (e.g., conductive contacts atop the upper pillar structures 1104 (FIG. 17 and FIG. 18)).

Figure 20:
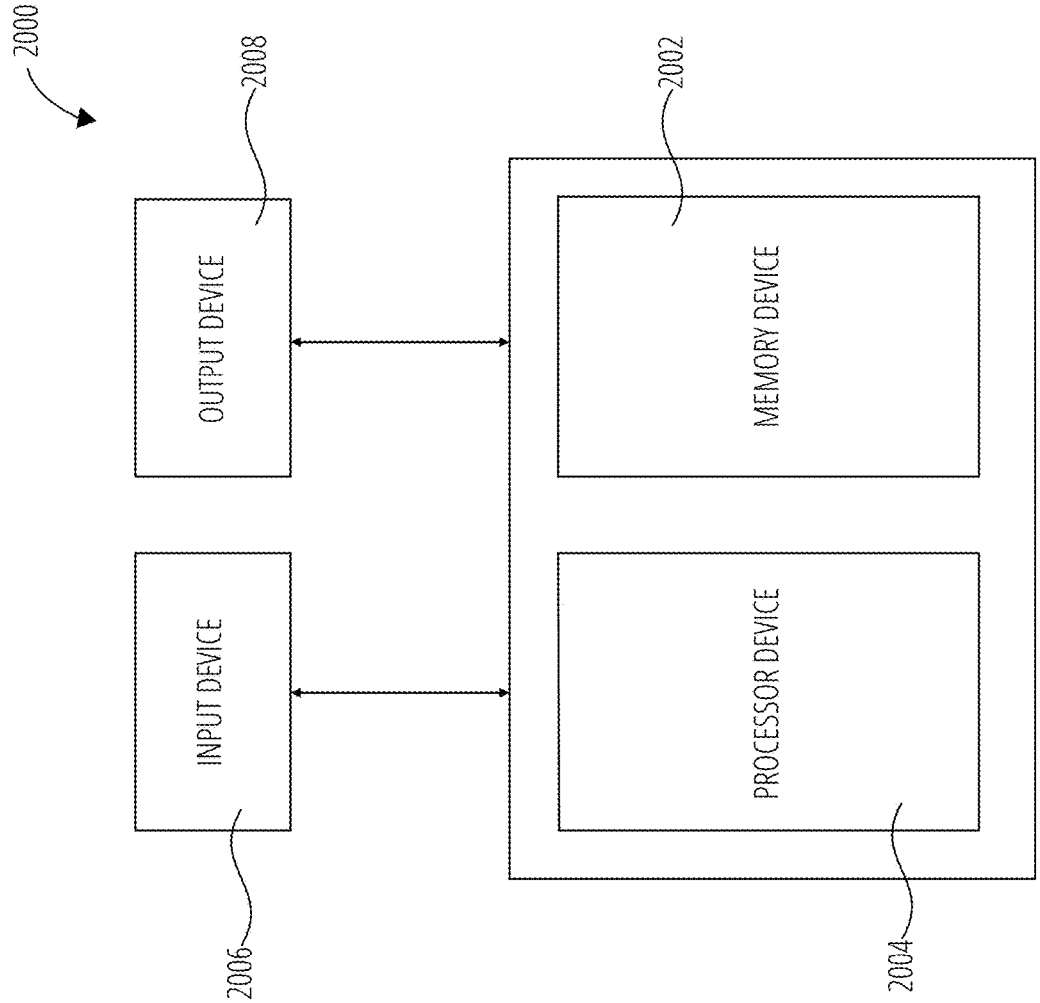
FIG. 20 is a block diagram of an electronic system, in accordance with embodiments of the disclosure.

Microelectronic devices (e.g., the microelectronic device 1900) including microelectronic device structures, such as the microelectronic device structure 1700 of FIG. 17 and FIG. 18, may be used in embodiments of electronic systems of the disclosure. For example, FIG. 20 is a block diagram of an electronic system 2000, in accordance with embodiments of the disclosure. The electronic system 2000 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 2000 includes at least one memory device 2002. The memory device 2002 may include, for example, an embodiment of a microelectronic device and/or structure previously described herein (e.g., the microelectronic device structure 1700 of FIG. 17 and FIG. 18, the microelectronic device 1900 of FIG. 19), with structures formed according to methods of embodiments previously described herein.

The electronic system 2000 may further include at least one electronic signal processor device 2004 (often referred to as a "microprocessor"). The processor device 2004 may, optionally, include an embodiment of a microelectronic device and/or a microelectronic device structure previously described herein (e.g., one or more of the microelectronic device structure 1700 of FIG. 17 and FIG. 18, the microelectronic device 1900 of FIG. 19). The electronic system 2000 may further include one or more input devices 2006 for inputting information into the electronic system 2000 by a user, such as, for example, a mouse or other pointing device, a keyboard, a touchpad, a button, or a control panel. The electronic system 2000 may further include one or more output devices 2008 for outputting information (e.g., visual or audio output) to a user such as, for example, a monitor, a display, a printer, an audio output jack, a speaker, etc. In some embodiments, the input device 2006 and the output device 2008 may comprise a single touchscreen device that can be used both to input information into the electronic system 2000 and to output visual information to a user. The input device 2006 and the output device 2008 may communicate electrically with one or more of the memory device 2002 and the electronic signal processor device 2004.

Figure 21:
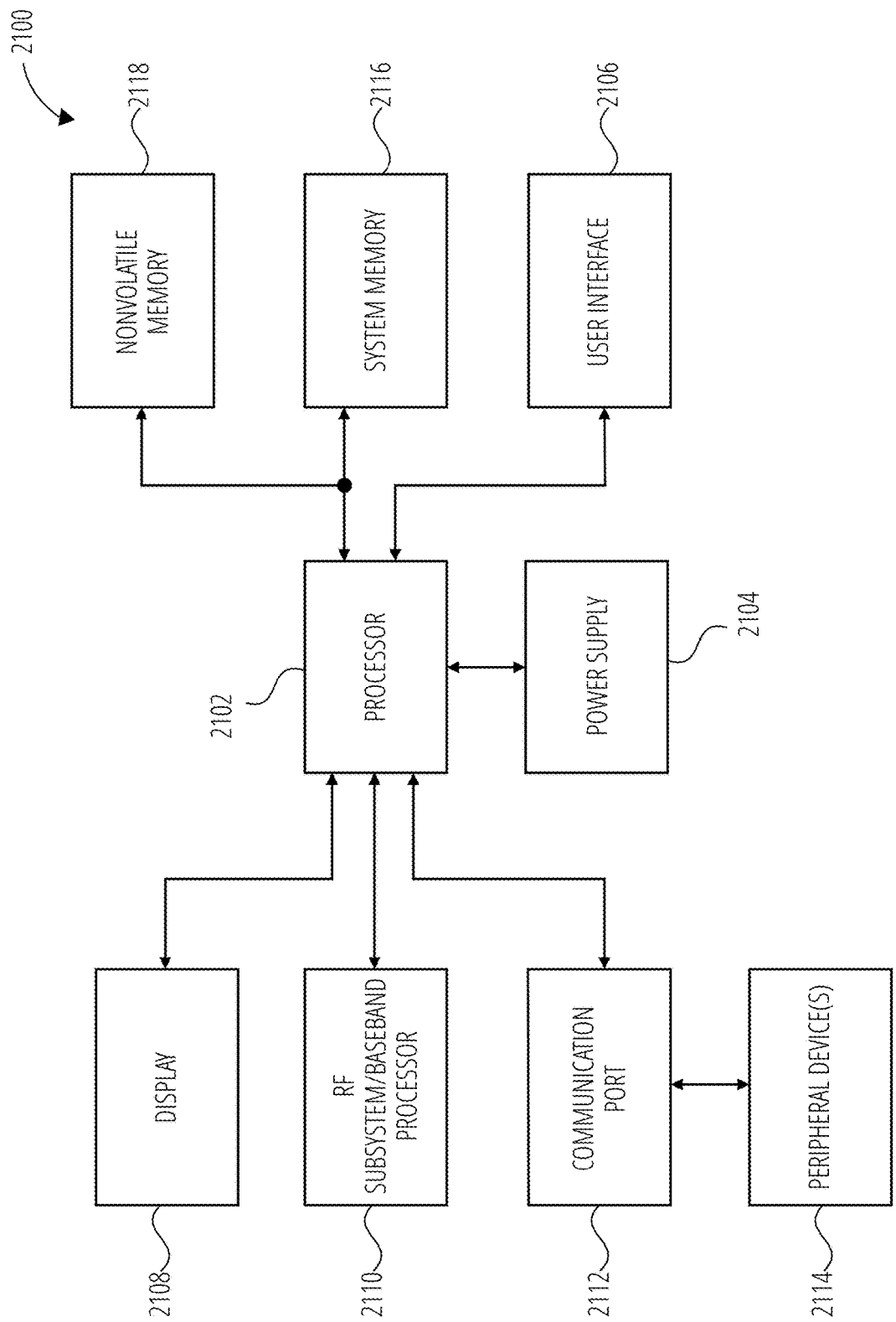
FIG. 21 is a block diagram of a processor-based system, in accordance with embodiments of the disclosure.

With reference to FIG. 21, shown is a block diagram of a processor-based system 2100. The processor-based system 2100 may include various microelectronic devices (e.g., the microelectronic device 1900 of FIG. 19) and microelectronic device structures (e.g., the microelectronic device structure 1700 of FIG. 17 and FIG. 18) manufactured in accordance with embodiments of the present disclosure (e.g., the method of FIG. 1 to FIG. 17). The processor-based system 2100 may be any of a variety of types, such as a computer, a pager, a cellular phone, a personal organizer, a control circuit, or another electronic device. The processor-based system 2100 may include one or more processors 2102, such as a microprocessor, to control the processing of system functions and requests in the processor-based system 2100. The processor 2102 and other subcomponents of the processor-based system 2100 may include microelectronic devices (e.g., the microelectronic device 1900 of FIG. 19) and microelectronic device structures (e.g., the microelectronic device structure 1700 of FIG. 17 and FIG. 18) manufactured in accordance with embodiments of the present disclosure (e.g., the method of FIG. 1 to FIG. 17).

The processor-based system 2100 may include a power supply 2104 in operable communication with the processor 2102. For example, if the processor-based system 2100 is a portable system, the power supply 2104 may include one or more of a fuel cell, a power scavenging device, permanent batteries, replaceable batteries, and/or rechargeable batteries. The power supply 2104 may also include an AC adapter; therefore, the processor-based system 2100 may be plugged into a wall outlet, for example. The power supply 2104 may also include a DC adapter such that the processor-based system 2100 may be plugged into a vehicle cigarette lighter or a vehicle power port, for example.

Various other devices may be coupled to the processor 2102 depending on the functions that the processor-based system 2100 performs. For example, a user interface 2106 may be coupled to the processor 2102. The user interface 2106 may include one or more input devices, such as buttons, switches, a keyboard, a light pen, a mouse, a digitizer and stylus, a touch screen, a voice recognition system, a microphone, or a combination thereof. A display 2108 may also be coupled to the processor 2102. The display 2108 may include an LCD display, an SED display, a CRT display, a DLP display, a plasma display, an OLED display, an LED display, a three-dimensional projection, an audio display, or a combination thereof. Furthermore, an RF subsystem/baseband processor 2110 may also be coupled to the processor 2102. The RF subsystem/baseband processor 2110 may include an antenna that is coupled to an RF receiver and to an RF transmitter. A communication port 2112, or more than one communication port 2112, may also be coupled to the processor 2102. The communication port 2112 may be adapted to be coupled to one or more peripheral devices 2114 (e.g., a modem, a printer, a computer, a scanner, a camera) and/or to a network (e.g., a local area network (LAN), a remote area network, an intranet, or the Internet).

The processor 2102 may control the processor-based system 2100 by implementing software programs stored in the memory (e.g., system memory 2116). The software programs may include an operating system, database software, drafting software, word processing software, media editing software, and/or media-playing software, for example. The memory (e.g., the system memory 2116) is operably coupled to the processor 2102 to store and facilitate execution of various programs. For example, the processor 2102 may be coupled to system memory 2116, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 2116 may include volatile memory, nonvolatile memory, or a combination thereof. The system memory 2116 is typically large so it can store dynamically loaded applications and data. In some embodiments, the system memory 2116 may include semiconductor devices (e.g., the microelectronic device 1900 of FIG. 19) and structures (e.g., the microelectronic device structure 1700 of FIG. 17 and FIG. 18) described above, or a combination thereof.

The processor 2102 may also be coupled to nonvolatile memory 2118, which is not to suggest that system memory 2116 is necessarily volatile. The nonvolatile memory 2118 may include one or more of STT-MRAM, MRAM, read-only memory (ROM) (e.g., EPROM, resistive read-only memory (RROM)), and Flash memory to be used in conjunction with the system memory 2116. The size of the nonvolatile memory 2118 is typically selected to be just large enough to store any necessary operating system, application programs, and fixed data. Additionally, the nonvolatile memory 2118 may include a high-capacity memory (e.g., disk drive memory, such as a hybrid-drive including resistive memory or other types of nonvolatile solid-state memory, for example). The nonvolatile memory 2118 may include microelectronic devices (e.g., the microelectronic device 1900 of FIG. 19) and structures (e.g., the microelectronic device structure 1700 of FIG. 17 and FIG. 18) described above, or a combination thereof.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure, which comprises pillar structures. The pillar structures comprise a channel material. The pillar structures extend through a lower stack of vertically alternating insulative structures and conductive structures. The pillar structures also extend through an upper stack of vertically alternating insulative structures and conductive structures. The upper stack is above the lower stack. The conductive structures, of the lower stack, comprise a metal within a metal nitride liner. The conductive structures, of the upper stack, comprise the metal without a liner. The conductive structures, of the lower stack, are configured as word lines of the memory device. The conductive structures, of the upper stack, are configured as select gate structures of the memory device. The memory device also comprises strings of memory cells adjacent the pillar structures and extending through the lower stack. Isolation trenches extend through the upper stack and pass between neighboring pillar structures, of the pillar structures. The isolation trenches define nonplanar sidewalls. Slits extend through the upper stack and through the lower stack and define blocks of the pillar structures.

While the disclosed structures, apparatus (e.g., devices), systems, and methods are susceptible to various modifications and alternative forms in implementation thereof, specific embodiments have been shown by way of example in the drawings and have been described in detail herein.

However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a lower stack structure comprising a first vertically alternating sequence of first insulative structures and first conductive structures arranged in tiers, the first conductive structures comprising a conductive liner material and a conductive material within the conductive liner material;
an upper stack structure above the lower stack structure, the upper stack structure comprising a second vertically alternating sequence of second insulative structures and second conductive structures arranged in tiers, the second conductive structures comprising an additional conductive material and no liner material;
pillar structures, a pillar structure of the pillar structures comprising:
a lower pillar structure extending through the lower stack structure, the lower pillar structure comprising a channel material; and
an upper pillar structure extending through the upper stack structure, the upper pillar structure having a longitudinal centerline laterally offset from a longitudinal centerline of the lower pillar structure;
an isolation trench defined in the upper stack structure, between neighboring pillar structures of the pillar structures, the isolation trench having nonplanar sidewalls; and
an etch stop material between the lower stack structure and the upper stack structure.

2. The microelectronic device of claim 1, wherein the first insulative structures and the second insulative structures comprise an oxide material.

3. The microelectronic device of claim 1, further comprising a slit extending through the upper stack structure and the lower stack structure, the slit having planar sidewalls.

4. The microelectronic device of claim 3, wherein the slit is bordered by a liner along elevations of the upper stack structure, the liner not extending into elevations of the lower stack structure.

5. The microelectronic device of claim 3, wherein:
the isolation trench defines a width within a range of from about 30 nm to about 50 nm; and
the slit defines another width within a range of from about 100 nm to about 400 nm.

6. The microelectronic device of claim 1, wherein the isolation trench extends to or partially into the etch stop material.

7. The microelectronic device of claim 6, further comprising a slit extending through the upper stack structure, through the etch stop material, and through the lower stack structure.

8. The microelectronic device of claim 1, wherein:
a quantity of the tiers of the lower stack structure is within a range of from thirty-two tiers to two hundred fifty-six tiers; and
a quantity of the tiers of the upper stack structure is within a range of from one tier to eight tiers.

9. The microelectronic device of claim 1, wherein a width of the upper pillar structure is less than a width of the lower pillar structure.

10. The microelectronic device of claim 1, wherein the channel material extends along the etch stop material.

11. The microelectronic device of claim 10, wherein the channel material extends under a portion of the etch stop material.

12. A microelectronic device, comprising:
a lower stack structure comprising a first vertically alternating sequence of first insulative structures and first conductive structures arranged in tiers, the first conductive structures comprising a conductive liner material and a conductive material within the conductive liner material;
an upper stack structure above the lower stack structure, the upper stack structure comprising a second vertically alternating sequence of second insulative structures and second conductive structures arranged in tiers, the second conductive structures comprising an additional conductive material and no liner material;
pillar structures, a pillar structure of the pillar structures comprising:
a lower pillar structure extending through the lower stack structure, the lower pillar structure comprising a channel material; and
an upper pillar structure extending through the upper stack structure, the upper pillar structure having a longitudinal centerline laterally offset from a longitudinal centerline of the lower pillar structure; and
an isolation trench defined in the upper stack structure, between neighboring pillar structures of the pillar structures, the isolation trench having nonplanar sidewalls,
wherein the additional conductive material of the second conductive structures comprises a metal and at least one dopant species.

13. The microelectronic device of claim 12, wherein:
the conductive material of the first conductive structures comprises the metal of the second conductive structures; and
the conductive liner material of the first conductive structures comprises a nitride of the metal.

14. A microelectronic device, comprising:
a lower stack structure comprising a first vertically alternating sequence of first insulative structures and first conductive structures arranged in tiers, the first conductive structures comprising a conductive liner material and a conductive material within the conductive liner material;
an upper stack structure above the lower stack structure, the upper stack structure comprising a second vertically alternating sequence of second insulative structures and second conductive structures arranged in tiers, the second conductive structures comprising an additional conductive material and no liner material;
pillar structures, a pillar structure of the pillar structures comprising:
a lower pillar structure extending through the lower stack structure, the lower pillar structure comprising a channel material; and
an upper pillar structure extending through the upper stack structure, the upper pillar structure having a longitudinal centerline laterally offset from a longitudinal centerline of the lower pillar structure; and
an isolation trench defined in the upper stack structure, between neighboring pillar structures of the pillar structures, the isolation trench having nonplanar sidewalls,
wherein the conductive material of the first conductive structures is a same conductive material as the additional conductive material of the second conductive structures, the conductive material of the first conductive structures having a different microstructure than additional conductive material of the second conductive structures.

15. An electronic system, comprising:
an input device;
an output device;
a processor device operably coupled to the input device and to the output device; and
a memory device operably coupled to the processor device and comprising at least one microelectronic device structure, the at least one microelectronic device structure comprising:
   pillar structures comprising a channel material and extending through:
      a lower stack of vertically alternating insulative structures and conductive structures; and
      an upper stack of vertically alternating insulative structures and conductive structures, the upper stack being above the lower stack,
      the conductive structures, of the lower stack, comprising a metal within a metal nitride liner,
      the conductive structures, of the upper stack, comprising the metal without a liner,
      the conductive structures, of the lower stack, configured as word lines of the memory device,
      the conductive structures, of the upper stack, configured as select gate structures of the memory device,
   strings of memory cells adjacent the pillar structures and extending through the lower stack;
   isolation trenches extending through the upper stack and passing between neighboring pillar structures of the pillar structures, the isolation trenches defining nonplanar sidewalls; and
   slits extending through the upper stack and through the lower stack and defining blocks of the pillar structures.

16. A method of forming a microelectronic device, the method comprising:
   forming a lower stack structure comprising a first vertically alternating sequence of first insulative structures and sacrificial structures arranged in tiers;
   forming an etch stop material above the lower stack structure;
   forming a lower pillar structure extending through the lower stack structure, the lower pillar structure comprising a channel material;
   forming an upper stack structure above the etch stop material and the lower stack structure, the upper stack structure comprising a second vertically alternating sequence of second insulative structures and replaceable structures arranged in tiers;
   forming an upper pillar structure extending through the upper stack structure, the upper pillar structure comprising additional channel material;
   forming an isolation trench extending through the upper stack structure;
   after forming the isolation trench, replacing at least a portion of the replaceable structures with a conductive material to transform the upper stack structure to comprise the second vertically alternating sequence of the second insulative structures and second conductive structures arranged in the tiers, the second conductive structures comprising the conductive material and no liner material;
   forming a slit extending through the upper stack structure and through the lower stack structure, after replacing the at least the portion of the replaceable structures with the conductive material; and
   after forming the slit, replacing at least a portion of the sacrificial structures with a conductive liner material and another conductive material within the conductive liner material to transform the lower stack structure to comprise the first vertically alternating sequence of the first insulative structures and first conductive structures arranged in the tiers, the first conductive structures comprising the conductive liner material and the conductive material within the conductive liner material.

17. The method of claim 16, wherein:
   forming the first vertically alternating sequence of first insulative structures and sacrificial structures arranged in tiers comprises forming the first insulative structures to comprise an oxide material and forming the sacrificial structures to comprise a nitride material; and
   forming the second vertically alternating sequence of second insulative structures and replaceable structures arranged in tiers comprises forming the second insulative structures comprising the oxide material and forming the replaceable structures comprising a polysilicon material.

18. The method of claim 16, wherein the method does not comprise, prior to forming the slit, forming a void space that extends through both the lower stack structure and the upper stack structure.

19. The method of claim 16, further comprising:
   forming a partial slit extending through the upper stack structure, before replacing the at least the portion of the replaceable structures with the conductive material; and
   forming a dielectric material to fill the partial slit;
   wherein forming the slit comprises:
      etching through the dielectric material filling the partial slit; and
      etching through the tiers of the lower stack structure.

20. The method of claim 19, wherein etching through the dielectric material filling the partial slit comprises leaving a portion of the dielectric material to form a liner along an upper portion of the slit.

21. The method of claim 16, wherein forming the isolation trench extending through the upper stack structure comprises forming the isolation trench to have nonplanar sidewalls adjacent the upper pillar structure.

22. The method of claim 16, wherein neither forming the isolation trench extending through the upper stack structure nor forming the slit comprises removing metal material from either of the lower stack structure or the upper stack structure.

23. The method of claim 16, wherein replacing at least the portion of the replaceable structures with the conductive material comprises chemically converting the at least the portion of the replaceable structures to the conductive material.

* * * * *

UNITED STATES PATENT AND TRADEMARK OFFICE
CERTIFICATE OF CORRECTION

PATENT NO. : 11,362,142 B2
APPLICATION NO. : 16/877209
DATED : June 14, 2022
INVENTOR(S) : Yi Hu It is certified that error appears in the above-identified patent and that said Letters Patent is hereby corrected as shown below:

In the Specification

| | | |
|---|---|---|
| Column 5, | Line 5, | change "X"neighboring"" to -- "X neighboring" -- |
| Column 6, | Line 59, | change ""and/of"" to -- "and/or" -- |
| Column 15, | Line 29, | change "(e.g., 3-phase" to -- (e.g., β-phase -- |
| Column 16, | Line 12, | change "alpha (a)" to -- alpha (α) -- |
| Column 21, | Line 11, | change "((FIG. 17))," to -- (FIG. 17)), -- |

Signed and Sealed this
First Day of November, 2022

Katherine Kelly Vidal
*Director of the United States Patent and Trademark Office*